(12) United States Patent
Fujiwara et al.

(10) Patent No.: US 10,044,340 B2
(45) Date of Patent: Aug. 7, 2018

(54) LADDER-TYPE ELASTIC WAVE FILTER HAVING SERIES AND PARALLEL RESONATORS

(71) Applicant: SKYWORKS FILTER SOLUTIONS JAPAN CO., LTD., Kadoma-Shi (JP)

(72) Inventors: Joji Fujiwara, Osaka-Fu (JP); Tetsuya Tsurunari, Osaka-Fu (JP); Tomoya Komatsu, Osaka-Fu (JP); Hiroyuki Nakamura, Osaka-Fu (JP)

(73) Assignee: SKYWORKS FILTER SOLUTIONS JAPAN CO., LTD., Kadoma-Shi (JP)

( * ) Notice: Subject to any disclaimer, the term of this patent is extended or adjusted under 35 U.S.C. 154(b) by 58 days.

(21) Appl. No.: 15/184,354

(22) Filed: Jun. 16, 2016

(65) Prior Publication Data
US 2016/0301384 A1 Oct. 13, 2016

Related U.S. Application Data

(63) Continuation of application No. 14/248,111, filed on Apr. 8, 2014, now Pat. No. 9,467,117, which is a
(Continued)

(30) Foreign Application Priority Data

Nov. 30, 2011 (JP) .................................. 2011-261411
Feb. 14, 2012 (JP) .................................. 2012-029234
Jul. 25, 2012 (JP) .................................. 2012-164326

(51) Int. Cl.
*H03H 9/72* (2006.01)
*H03H 9/64* (2006.01)
(Continued)

(52) U.S. Cl.
CPC ........ H03H 9/725 (2013.01); H03H 9/02834 (2013.01); H03H 9/205 (2013.01);
(Continued)

(58) Field of Classification Search
CPC .......... H03H 9/02834; H03H 9/14588; H03H 9/205; H03H 9/56; H03H 9/568;
(Continued)

(56) References Cited

U.S. PATENT DOCUMENTS 5,638,036 A * 6/1997 Penunuri ............ H03H 9/6483
29/25.35
5,726,610 A 3/1998 Allen et al.
(Continued)

FOREIGN PATENT DOCUMENTS

JP H06-061783 A 3/1994
JP H06-152299 A 5/1994
(Continued)

OTHER PUBLICATIONS

English Translation of the Written Opinion of the International Searching Authority issued in International Application No. PCT/JP2012/007263 dated Jan. 29, 2013, 13 pages.
(Continued)

*Primary Examiner* — Barbara Summons
(74) *Attorney, Agent, or Firm* — Lando & Anastasi, LLP

(57) ABSTRACT

A ladder-type elastic wave filter includes an input terminal, an output terminal, and a ground terminal, a first series resonator and a second series resonator connected in series between the input terminal and the output terminal, and a first parallel resonator having a first terminal electrically connected to the series connection between the first series resonator and the second series resonator and a second terminal electrically connected to the ground terminal. A resonance frequency of the first parallel resonator is higher than a resonance frequency of both of the first series resonator and the second series resonator and lower than an antiresonance frequency of both of the first series resonator and the second series resonator.

20 Claims, 17 Drawing Sheets

Related U.S. Application Data continuation of application No. PCT/JP2012/007263, filed on Nov. 13, 2012.

(51) Int. Cl.
| | | |
|---|---|---|
| *H03H 9/02* | (2006.01) | |
| *H03H 9/205* | (2006.01) | |
| *H03H 9/60* | (2006.01) | |
| *H03H 9/56* | (2006.01) | |
| *H03H 9/145* | (2006.01) | |
| *H03H 9/70* | (2006.01) | |

(52) U.S. Cl.
CPC ............ *H03H 9/6483* (2013.01); *H03H 9/70* (2013.01); *H03H 9/14588* (2013.01); *H03H 9/56* (2013.01); *H03H 9/568* (2013.01); *H03H 9/605* (2013.01); *H03H 9/706* (2013.01)

(58) Field of Classification Search
CPC ........ H03H 9/605; H03H 9/64; H03H 9/6483; H03H 9/6493; H03H 9/70; H03H 9/706; H03H 9/725
USPC .......................................... 333/133, 193–196
See application file for complete search history.

(56) References Cited

U.S. PATENT DOCUMENTS

| | | | | |
|---|---|---|---|---|
| 5,949,306 A * | 9/1999 | Hickernell | ........... | H03H 9/6483 333/195 |
| 7,598,827 B2 | 10/2009 | Stuebing et al. | | |
| 9,281,800 B2 | 3/2016 | Tsuzuki | | |
| 9,467,117 B2 * | 10/2016 | Fujiwara | ............. | H03H 9/6483 |
| 2002/0021194 A1 * | 2/2002 | Maehara | ............. | H03H 9/6483 333/193 |
| 2003/0227358 A1 | 12/2003 | Inose | | |
| 2004/0227585 A1 | 11/2004 | Taniguchi et al. | | |
| 2005/0025324 A1 * | 2/2005 | Takata | ................. | H03H 9/6483 381/190 |
| 2008/0074212 A1 | 3/2008 | Matsuda et al. | | |
| 2009/0201104 A1 | 8/2009 | Ueda et al. | | |
| 2010/0109801 A1 | 5/2010 | Inoue et al. | | |
| 2010/0110940 A1 | 5/2010 | Hara et al. | | |
| 2010/0141088 A1 | 6/2010 | Matsuda et al. | | |
| 2011/0090026 A1 | 4/2011 | Nakahashi et al. | | |
| 2012/0086521 A1 | 4/2012 | Tsurunari et al. | | |
| 2012/0293277 A1 | 11/2012 | Hara et al. | | |
| 2013/0241674 A1 * | 9/2013 | Yamazaki | ........... | H03H 9/6483 333/189 |

FOREIGN PATENT DOCUMENTS

| | | |
|---|---|---|
| JP | H09-116379 A | 5/1997 |
| JP | H10-150342 A | 6/1998 |
| JP | H10-335977 A | 12/1998 |
| JP | H11-312951 A | 11/1999 |
| JP | 2000-077972 A | 3/2000 |
| JP | 2003-332884 A | 11/2003 |
| JP | 2004-015397 A | 1/2004 |
| JP | 2007-006274 A | 1/2007 |
| JP | 2008079227 A | 4/2008 |
| JP | 2008-245310 A | 10/2008 |
| JP | 2009-207116 A | 9/2009 |
| JP | 2010-109894 A | 5/2010 |
| WO | 2009/022410 A1 | 2/2009 |
| WO | 2009/025055 A1 | 2/2009 |
| WO | 2010001522 A1 | 1/2010 |
| WO | 2010146826 A1 | 12/2010 |
| WO | 2011/096245 A1 | 8/2011 |

OTHER PUBLICATIONS

International Search Report issued in International Application No. PCT/JP2012/007263 dated Jan. 29, 2013, with English Translation.

* cited by examiner

LADDER-TYPE ELASTIC WAVE FILTER HAVING SERIES AND PARALLEL RESONATORS

CROSS-REFERENCE TO RELATED APPLICATION

This application claims priority under 35 U.S.C. § 120 as a continuation of U.S. patent application Ser. No. 14/248,111, titled "LADDER-TYPE ELASTIC WAVE FILTER AND ANTENNA DUPLEXER USING SAME," filed Apr. 8, 2014, which claims priority under 35 U.S.C. § 120 as a continuation of PCT Application No. PCT/JP2012/007263, titled "LADDER-TYPE ELASTIC WAVE FILTER AND ANTENNA DUPLEXER USING SAME," filed Nov. 13, 2012, which in turn claims the benefit of Japanese Application No. 2011-261411, filed Nov. 30, 2011, Japanese Application No. 2012-029234, filed on Feb. 14, 2012, and Japanese Application No. 2012-164326, filed on Jul. 25, 2012. Each of these applications is incorporated herein by reference in its entirety for all purposes.

BACKGROUND

1. Technical Field

The present technical field relates to a ladder-type elastic wave filter and an antenna duplexer using the same.

2. Background Art

A conventional ladder-type elastic wave filter is described with reference to a drawing. FIG. 13 is a circuit block diagram of a conventional antenna duplexer which includes a ladder-type elastic wave filter.

In FIG. 13, conventional antenna duplexer 101 is, for example, an antenna duplexer of the UMTS system, and includes ladder-type elastic wave filter 102 as a transmission filter and reception filter 103 having a passband higher than a passband of ladder-type elastic wave filter 102. Ladder-type elastic wave filter 102 is connected between input terminal 104 and antenna terminal 105, receives a transmission signal from input terminal 104, and outputs it from antenna terminal 105. Ladder-type elastic wave filter 102 includes series resonators 108, 109, 110, and 111, and parallel resonators 112, 113, and 114 having a lower resonance frequency than antiresonance frequencies of the series resonators, which are connected to each other in a ladder form. Furthermore, ground terminal 117 sides of parallel resonators 112, 113, and 114 are connected to each other at connection part 116, and ladder-type elastic wave filter 102 includes inductor 115 connected between connection part 116 and ground terminal 117.

Furthermore, reception filter 103 includes, for example, resonator 119 and longitudinal mode coupled filter 118, which are connected between antenna terminal 105 and output terminal (balanced terminal) 106. Reception filter 103 receives a received signal from antenna terminal 105 and outputs it from output terminal 106.

Furthermore, antenna duplexer 101 includes phase shifter 107 connected between ladder-type elastic wave filter 102 and reception filter 103. Phase shifter 107 allows the passband of each of the transmission and reception filters to have a higher impedance in view of each other so as to improve isolation to each other.

SUMMARY

The present disclosure provides a ladder-type elastic wave filter in which steepness of passing characteristic at a frequency region higher than a passband thereof is secured. The ladder-type elastic wave filter according to various embodiments includes a series resonator connected between an input terminal and an output terminal; a first parallel resonator connected between the series resonator and a ground terminal, and having a resonance frequency lower than an antiresonance frequency of the series resonator; and a second parallel resonator connected in parallel to the first parallel resonator. The second parallel resonator has a resonance frequency higher than the resonance frequency of the series resonator and lower than the antiresonance frequency of the series resonator.

With the above-mentioned configuration, at the frequency region higher than the passband of the ladder-type elastic wave filter, an attenuation pole by the second parallel resonator is formed in a lower frequency region than an attenuation pole formed by the series resonator. This makes it possible to secure steepness of the passing characteristic at the frequency region higher than the passband of the ladder-type elastic wave filter.

DETAILED DESCRIPTION OF PREFERRED EMBODIMENTS

Prior to description of exemplary embodiments, problems of a conventional configuration are described. In ladder-type elastic wave filter 102 that is a transmission filter of conventional antenna duplexer 101, antiresonance frequencies of series resonators 108, 109, 110, and 111 are set in the vicinity of a frequency region higher than the passband of ladder-type elastic wave filter 102, and resonance frequencies of parallel resonators 112, 113, and 114 are set in the vicinity of a frequency region lower than ladder-type elastic wave filter 102. Thereby, attenuation poles are formed in the vicinity of both higher and lower frequency region than the passband of ladder-type elastic wave filter 102. However, it is difficult to secure steepness of passing characteristic at the frequency region higher than the passband of ladder-type elastic wave filter 102 as a transmission filter of conventional antenna duplexer 101.

First Exemplary Embodiment

Figure 1:
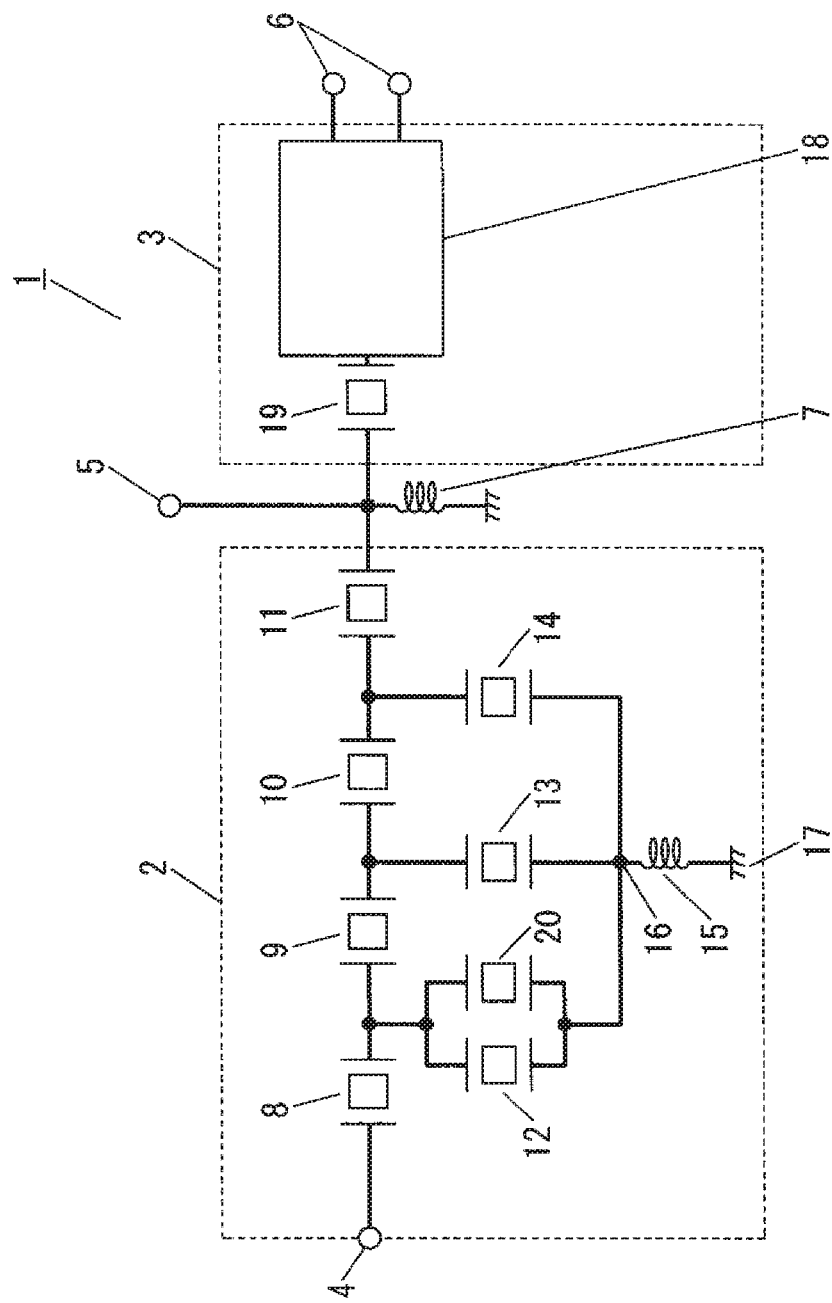
FIG. 1 is a circuit block diagram of an antenna duplexer including a ladder-type elastic wave filter in accordance with a first exemplary embodiment of the present disclosure.

Hereinafter, an elastic wave element in accordance with a first exemplary embodiment of the present disclosure is described with reference to drawings. FIG. 1 is a circuit block diagram of antenna duplexer 1 including a ladder-type elastic wave filter in accordance with the first exemplary embodiment.

In FIG. 1, antenna duplexer 1 including the ladder-type elastic wave filter in accordance with the first exemplary embodiment is, for example, an antenna duplexer for Band-8 of the UMTS system, and includes ladder-type elastic wave filter 2 as a transmission filter and reception filter 3 having a passband (925 MHz to 960 MHz) higher than a passband (880 MHz to 915 MHz) of ladder-type elastic wave filter 2. Furthermore, antenna duplexer 1 includes phase shifter 7 connected between ladder-type elastic wave filter 2 and reception filter 3. Phase shifter 7 allows the passband of each of the transmission and reception filters to have a higher impedance in view of each other so as to improve isolation between the transmission and reception filters.

Reception filter 3 includes, for example, resonator 19 and longitudinal mode coupled filter 18 which are connected between antenna terminal 5 and output terminal (balanced terminal) 6, and receives a received signal from antenna terminal 5 and outputs it from output terminal 6.

Ladder-type elastic wave filter 2 as the transmission filter is connected between input terminal 4 and antenna terminal 5 (an output terminal of ladder-type elastic wave filter 2), receives a transmission signal from input terminal 4 and outputs it from antenna terminal 5. Ladder-type elastic wave filter 2 includes series resonators 8, 9, 10, and 11 each of which is connected to each of a plurality of series arms, and first parallel resonators 12, 13, and 14 each of which is connected to each of a plurality of parallel arms, in which series resonators 8, 9, 10, and 11 and first parallel resonators 12, 13, and 14 are connected to each other in a ladder form. Resonance frequencies of first parallel resonators 12, 13, and 14 are lower than resonance frequencies or antiresonance frequencies of series resonators 8, 9, 10, and 11.

Furthermore, ground terminal 17 sides of first parallel resonators 12, 13, and 14 are connected to each other at connection part 16, ladder-type elastic wave filter 2 includes inductor 15 connected between connection part 16 and ground terminal 17.

In ladder-type elastic wave filter 2 thus constructed as the transmission filter in antenna duplexer 1, the antiresonance frequencies of series resonators 8, 9, 10, and 11 are set in the vicinity of the passband of ladder-type elastic wave filter 2 in a frequency region higher than the passband of ladder-type elastic wave filter 2, and the resonance frequencies of first parallel resonators 12, 13, and 14 are set in the vicinity of the passband of ladder-type elastic wave filter 2 in a frequency region lower than the passband of ladder-type elastic wave filter 2. Attenuation poles are formed in the both vicinities of the passband of ladder-type elastic wave filter 2 at the higher and lower frequency sides.

In addition, in antenna duplexer 1, ladder-type elastic wave filter 2 includes second parallel resonator 20 connected in parallel to first parallel resonator 12 by one of the parallel arms and having a resonance frequency higher than resonance frequencies of resonators 8, 9, 10, and 11 and lower than antiresonance frequencies of series resonators 8, 9, 10, and 11. Second parallel resonator 20 operates as a band attenuation filter (notch filter) that attenuates an input signal around the resonance frequency of second parallel resonator 20. Note here that second parallel resonator 20 may be singly connected to a parallel arm between one of the series resonators and the ground terminal without being connected to any of the parallel arms to which the first parallel resonators are connected respectively.

With the above-mentioned configuration, in ladder-type elastic wave filter 2, an attenuation pole by the second parallel resonator is formed in a frequency region lower than an attenuation pole formed by the series resonators in a frequency region higher than the passband of ladder-type elastic wave filter 2. Thus, it is possible to secure steepness of the passing characteristics in a frequency region higher than the passband of ladder-type elastic wave filter 2.

Figure 2:
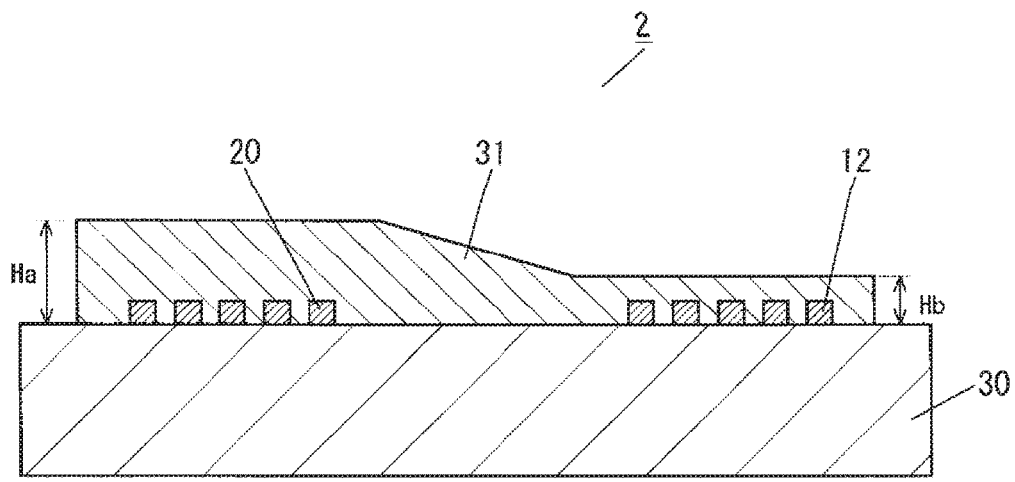
FIG. 2 is a sectional schematic view of the ladder-type elastic wave filter in accordance with the first exemplary embodiment of the present disclosure.

Each component of ladder-type elastic wave filter 2 of the first exemplary embodiment is described in detail with reference to FIGS. 1 and 2. FIG. 2 is a sectional schematic view of ladder-type elastic wave filter 2 of the first exemplary embodiment.

In ladder-type elastic wave filter 2, series resonators 8, 9, 10, and 11, first parallel resonators 12, 13, and 14, and second parallel resonator 20 are formed on piezoelectric substrate 30. Furthermore, inductor 15 may be formed on piezoelectric substrate 30 directly or indirectly via a dielectric layer, or may be formed on a laminated ceramic substrate (not shown) on which piezoelectric substrate 30 is mounted.

Figure 3:
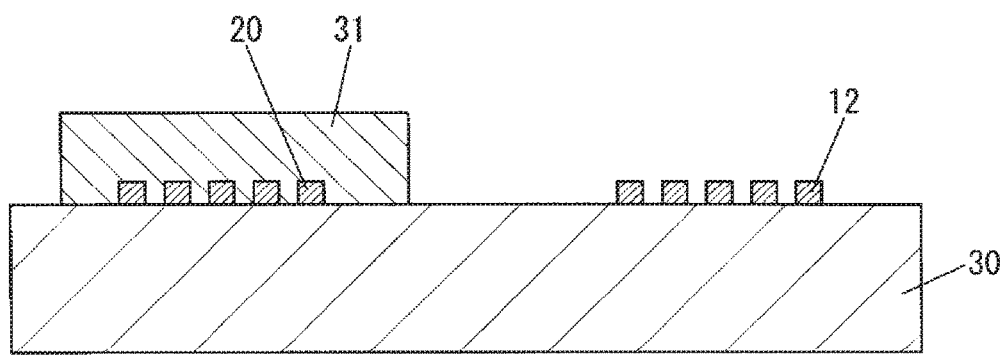
FIG. 3 is a sectional schematic view of the ladder-type elastic wave filter in accordance with the first exemplary embodiment of the present disclosure.

Piezoelectric substrate 30 is, for example, a quartz, lithium niobate (LiNbO$_3$)-based, or lithium tantalate (LiTaO$_3$)-based, potassium niobate (KNbO$_3$)-based piezoelectric monocrystal substrate. When dielectric layer 31 is formed on piezoelectric substrate 30 so as to cover resonators 8 to 14, and 20, dielectric layer 31 is formed of, for example, silicon oxide (SiO$_2$), silicon nitride (SiN), aluminum nitride (AlN), or a laminated body thereof. Even when dielectric layer 31 may be formed in the same thickness on resonators 8 to 14, and 20, it is possible to obtain the effect of the steepness of ladder-type elastic wave filter 2, which is the effect of the disclosure. Note here that when dielectric layer 31 has a frequency temperature coefficient with an opposite sign to a frequency temperature coefficient of piezoelectric substrate 30 such as silicon oxide (SiO$_2$), it is desirable that film thickness Ha of dielectric layer 31 on a comb electrode of second parallel resonator 20 is larger than film thickness Hb of dielectric layer 31 on a comb electrode of first parallel resonators 12, 13, and 14. Furthermore, as shown in FIG. 3, when dielectric layer 31 is provided on the comb electrode of second parallel resonator 20, dielectric layer 31 may not be provided on first parallel resonators 12, 13, and 14. Such a configuration can improve frequency temperature characteristics of second parallel resonator 20 which have the most effect on the filter property, among resonators 12, 13, 14, and 20 forming a filter property in a frequency region higher than the passband of ladder-type elastic wave filter 2. That is to say, in antenna duplexer 1, it is possible to obtain the passing characteristics of antenna duplexer 1 in a cross-band between the passband of ladder-type elastic wave filter 2 as the transmission filter and the passband of reception filter 3.

Each of series resonators 8, 9, 10, and 11, first parallel resonators 12, 13, and 14, and second parallel resonator 20 includes a pair of comb electrodes (interdigital transducer electrodes) and two reflectors sandwiching the comb electrodes in the propagation direction of main elastic wave. The comb electrodes and the reflectors are formed on a piezoelectric substrate. The comb electrodes constituting these resonators are formed of, for example, simple substance of metal including aluminum, copper, silver, gold, titanium, tungsten, molybdenum, platinum, or chromium, or alloys including the metal as a main component, or a laminated body thereof. Note here that the comb electrode may be an electrode that excites a surface acoustic wave such as SH (Shear Horizontal) wave, Reilly, or the like, as primary wave, or may be an electrode that excites a bulk wave such as a Lamb wave.

The resonance frequency [GHz] and the antiresonance frequency [GHz] of each of series resonators 8, 9, 10, and 11, and second parallel resonator 20 are shown in Table 1.

TABLE 1

|  | resonance frequency (GHz) | antiresonance frequency (GHz) |
| --- | --- | --- |
| series resonator 8 | 0.89 | 0.925 |
| series resonator 9 | 0.90 | 0.93 |
| series resonator 10 | 0.91 | 0.94 |
| series resonator 11 | 0.90 | 0.93 |
| second parallel resonator 20 | 0.92 | 0.95 |

Figure 13:
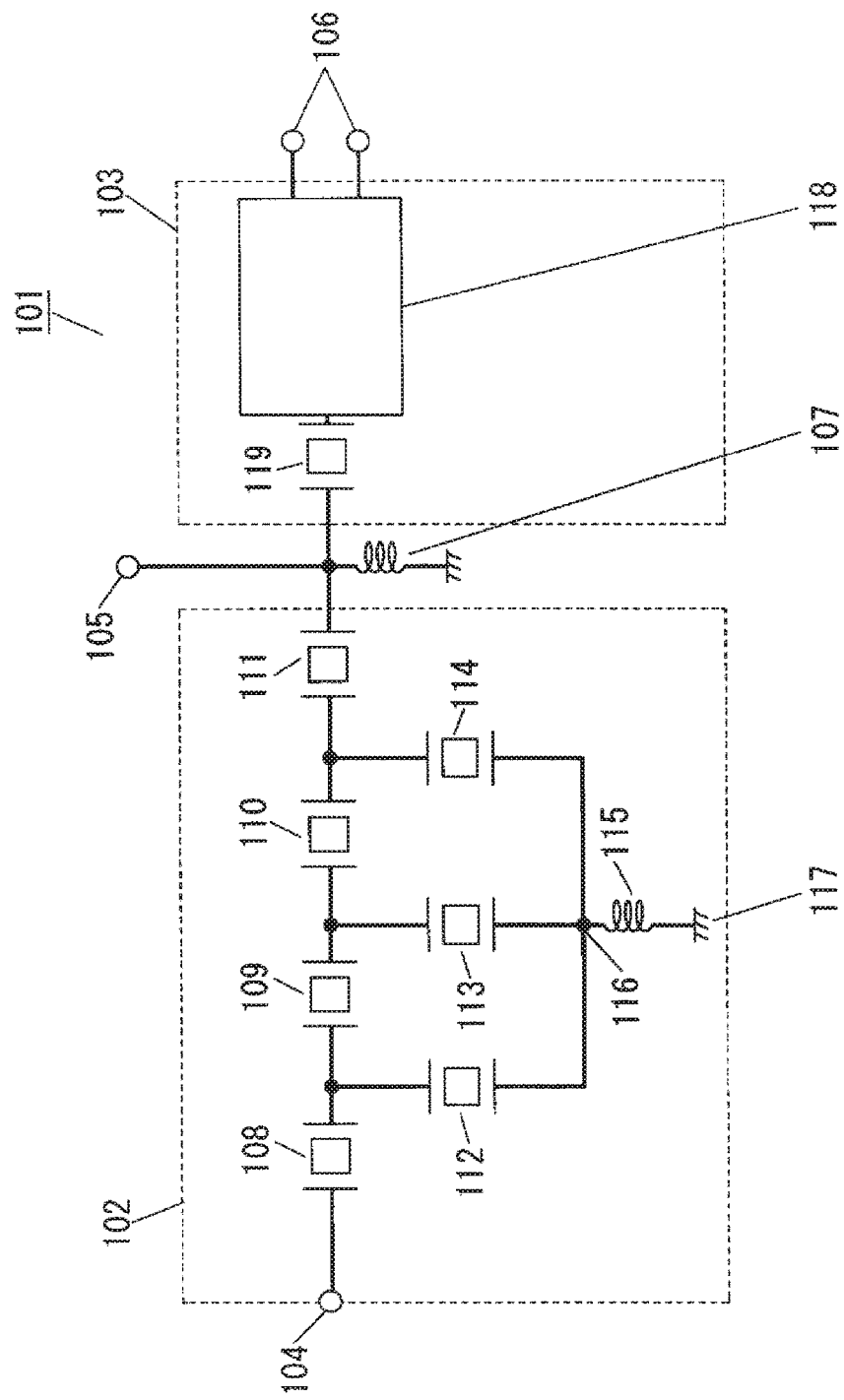
FIG. 13 is a circuit block diagram of an antenna duplexer including a conventional ladder-type elastic wave filter.

The resonance frequency [GHz] and the antiresonance frequency [GHz] of each of series resonators 108, 109, 110, and 111 in conventional ladder-type elastic wave filter 102 of FIG. 13 are shown in Table 2.

TABLE 2

|  | resonance frequency (GHz) | antiresonance frequency (GHz) |
| --- | --- | --- |
| series resonator 108 | 0.89 | 0.92 |
| series resonator 109 | 0.90 | 0.93 |
| series resonator 110 | 0.91 | 0.94 |
| series resonator 111 | 0.90 | 0.93 |

Figure 4:
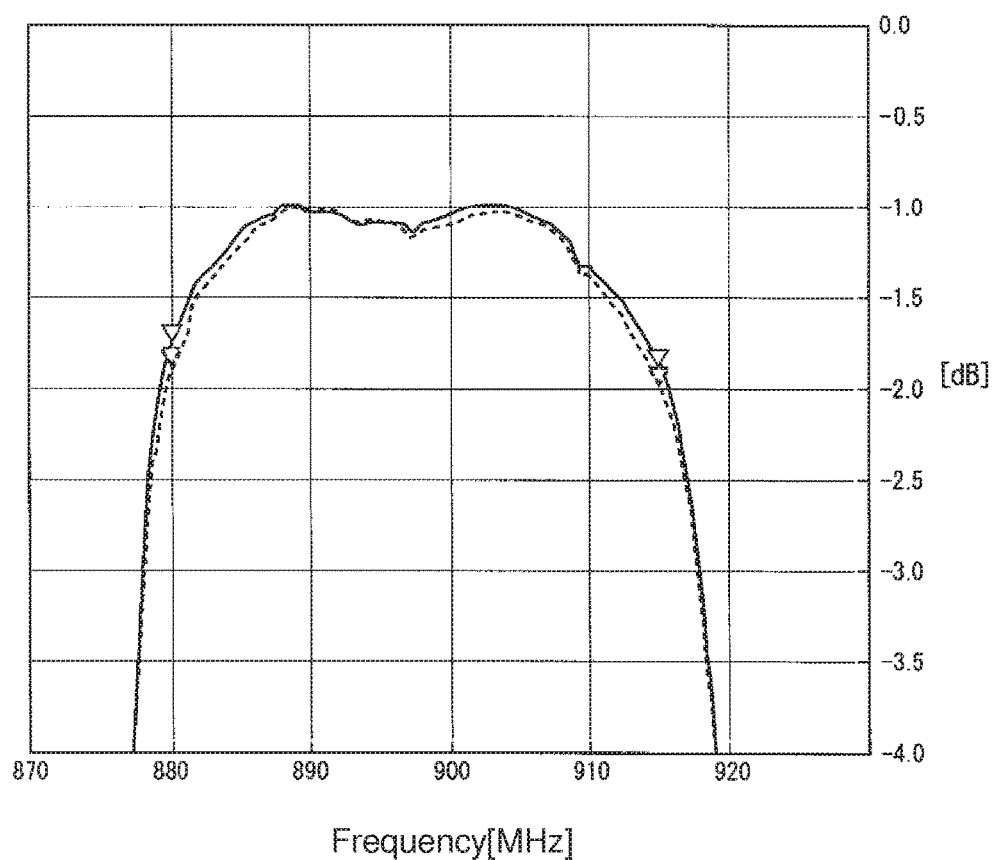
FIG. 4 is a characteristic comparison graph between the ladder-type elastic wave filter in accordance with the first exemplary embodiment of the present disclosure and a conventional ladder-type elastic wave filter.

Characteristic comparison between ladder-type elastic wave filter 2 of the first exemplary embodiment and conventional ladder-type elastic wave filter 102 is shown in FIG. 4. A characteristic shown by a solid line in FIG. 4 is a characteristic of ladder-type elastic wave filter 2 of the first exemplary embodiment and a characteristic shown by a broken line is a characteristic of conventional ladder-type elastic wave filter 102. In FIG. 4, the abscissa shows a frequency [MHz], and the ordinate shows gain [dB]. Note here that downward triangles show an upper limit and a lower limit of the frequency in the passband of the filters, respectively.

As shown in FIG. 4, it is shown that ladder-type elastic wave filter 2 is improved in the steepness of the passing characteristics in a frequency region higher than the passband of ladder-type elastic wave filter 2 as compared with that of the conventional ladder-type elastic wave filter 102.

Note here that series resonator 108 having the lowest antiresonance frequency has larger power consumption as compared with that of the other series resonators 109, 110, and 111, and it easily generates heat. Thus, when the resonance frequency of second parallel resonator 20 is set to be lower than the antiresonance frequency of series resonator 8 having the lowest antiresonance frequency among series resonators 8, 9, 10, and 11 in ladder-type elastic wave filter 2 of the first exemplary embodiment, the antiresonance frequency of series resonator 8 can be shifted to a higher frequency region side from the antiresonance frequency of conventional series resonator 108, and heat generation of series resonator 8 can be suppressed. In this case, in second parallel resonator 20, since excitation of primary elastic wave in the frequency region lower than the resonance frequency is suppressed, heat generation is suppressed. As a result, electric power resistance of ladder-type elastic wave filter 2 can be improved.

Furthermore, it is desirable that second parallel resonator 20 has capacitance smaller than that of first parallel resonators 12, 13, and 14. The reason for this is described below. In a frequency region lower than the attenuation pole formed by second parallel resonator 20, second parallel resonator 20 as a band attenuation filter shows capacitative property. Thus, when capacitance of second parallel resonator 20 is larger than capacitance of first parallel resonators 12, 13, and 14, steepness in the frequency region higher than the passband of ladder-type elastic wave filter 2 is deteriorated in the frequency region lower than the attenuation pole formed by second parallel resonator 20. Then, when the capacitance of second parallel resonator 20 is made to be smaller than the capacitance of first parallel resonators 12, 13, and 14, the steepness at the frequency region higher than the passband of ladder-type elastic wave filter 2 can be improved.

Furthermore, although not shown in the drawings, it is desirable that second parallel resonator 20 is connected in parallel to first parallel resonator 13 by the same parallel arm. First parallel resonator 13 is other than first parallel resonator 12 that is nearest to input terminal 4 among a plurality of first parallel resonators. An electrode finger pitch of second parallel resonator 20 is smaller than electrode finger pitches of series resonators 8, 9, 10, and 11, and first parallel resonators 12, 13, and 14, and electric power resistance of second parallel resonator 20 is relatively low. Thus, when second parallel resonator 20 is not connected to the parallel arm at an input terminal 4 side that requires the largest electric power resistance but connected to a parallel arm other than the parallel arm, the electric power resistance of ladder-type elastic wave filter 2 can be improved.

Figure 5:
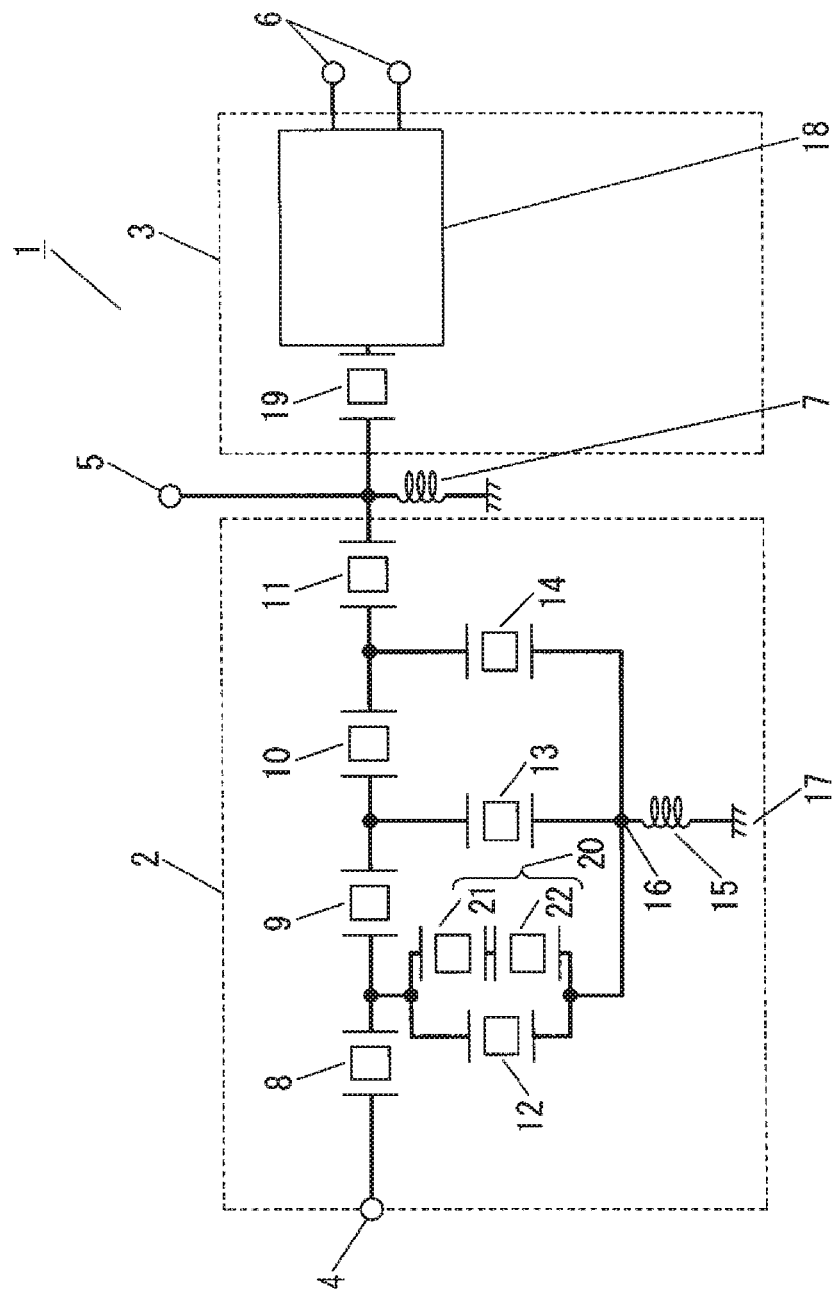
FIG. 5 is a circuit block diagram of an antenna duplexer including a ladder-type elastic wave filter in accordance with the first exemplary embodiment of the present disclosure.

Furthermore, as shown in FIG. 5, it is desirable that second parallel resonator 20 has a configuration in which each of a plurality of resonators 21 and 22 is cascade connected to each other. The electrode finger pitch of second parallel resonator 20 is smaller than the electrode finger pitches of first parallel resonators 12, 13, and 14, and the electric power resistance of second parallel resonator 20 is relatively low. Thus, when second parallel resonator 20 includes cascade-connected resonators 21 and 22, electric power resistance of second parallel resonator 20 is improved, and electric power resistance of ladder-type elastic wave filter 2 can be enhanced. In particular, the cascade connection configuration of resonators 21 and 22 is particularly preferable because electric power resistance of second parallel resonator 20 can be enhanced when the capacitance of second parallel resonator 20 is not more than that of first parallel resonator 12 connected to the same parallel arm as that of second parallel resonator 20.

Note here that the capacitance of each of resonators 21 and 22 is twice as large as the capacitance of second parallel resonator 20 in FIG. 1. As the means, for example, an interdigitating width of electrode fingers of each of resonators 21 and 22 may be twice as that of second parallel resonator 20 in FIG. 1, or the number of electrode fingers may be twice as many as that of second parallel resonator 20 in FIG. 1. When second parallel resonator 20 includes a plurality of cascade-connected resonators, making capacitance of each resonator equal to each other allows the applied voltage to be divided uniformly among the resonators. As a result, electric power resistance of second parallel resonator 20 is further improved, and electric power resistance of ladder-type elastic wave filter 2 can be further improved.

Furthermore, when the capacitance of second parallel resonator 20 is not more than the capacitance of first parallel resonator 12, it is preferable that a total occupied area of resonators 21 and 22 constituting second parallel resonator 20 is made to be larger than that of first parallel resonator 12. Thanks to the constitution, electric power resistance of second parallel resonator 20 is improved.

Figure 6:
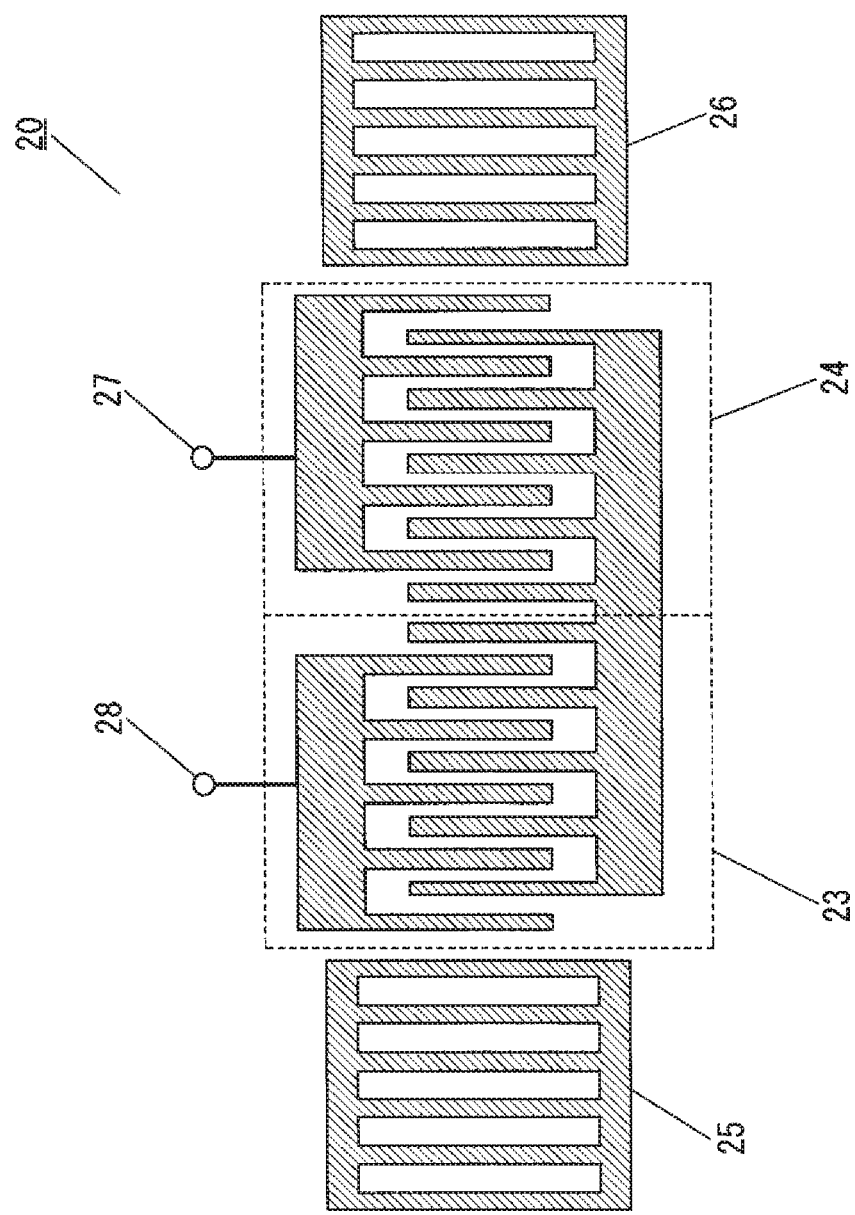
FIG. 6 is an upper schematic view of a second parallel resonator of the ladder-type elastic wave filter in accordance with the first exemplary embodiment of the present disclosure.

Furthermore, second parallel resonator 20 shown in FIG. 5 is divided in a propagation direction of the elastic wave as shown in FIG. 6, and may be a resonator including a comb electrode having electrode fingers in which each of the divided regions 23 and 24 are disposed in an opposite phase to each other, and reflectors 25 and 26 sandwiching thereof. The divided regions 23 and 24 form resonators 21 and 22 shown in FIG. 5, respectively. Note here that terminal 27 is connected to series resonators 8 and 9, and terminal 28 is connected to connection part 16. With this configuration, while the electric power resistance of second parallel resonator 20 is secured and the occupied area can be reduced, and the attenuation pole formed by second parallel resonator 20 is increased, thus the attenuation characteristics in the frequency region higher than the passband of ladder-type elastic wave filter 2 are improved.

Note here that second parallel resonator 20 shown in FIGS. 5 and 6 is divided into two parts, but it may be divided into three parts or more so as to further improve electric power resistance of second parallel resonator 20.

Furthermore, the first exemplary embodiment describes second parallel resonator 20 having a resonance frequency higher than the resonance frequencies of series resonators 8, 9, 10, and 11 and lower than the antiresonance frequencies thereof. However, when greater importance is placed on the attenuation characteristics than the steepness, second parallel resonator 20 may have resonance frequency higher than that of at least one of series resonators 8, 9, 10, and 11 and lower than antiresonance frequency of at least one of resonators 8, 9, 10, and 11 and lower.

Furthermore, in antenna duplexer 1 such as a duplexer including a first filter and a second filter having a higher passband of the first filter, it is preferable that ladder-type elastic wave filter 2 is used as the first filter having a relatively low passband. Thanks to the structure, it is possible to secure steepness of the passing characteristics of the first filter in the cross-band between the passband of the first filter and the passband of the second filter. That is to say, in the case of the above-mentioned ladder-type elastic wave filter 2, it is possible to secure steepness of the passing characteristics of the ladder-type elastic wave filter 2 in the cross-band between the passband of the ladder-type elastic wave filter 2 as a transmission filter and the passband of reception filter 3. Herein, by setting the resonance frequency of second parallel resonator 20 of a first filter (ladder-type elastic wave filter 2 as a transmission filter) in the passband of a second filter (reception filter 3), attenuation characteristics can be further improved.

Furthermore, ladder-type elastic wave filter 2 of the first exemplary embodiment may be mounted on an electronic apparatus provided with a semiconductor integrated circuit element (not shown) connected to the filter and an audio unit (not shown) such as a loudspeaker connected to the semiconductor integrated circuit element (not shown). Thus, communication quality of the electronic apparatus can be improved.

Second Exemplary Embodiment

Figure 7:
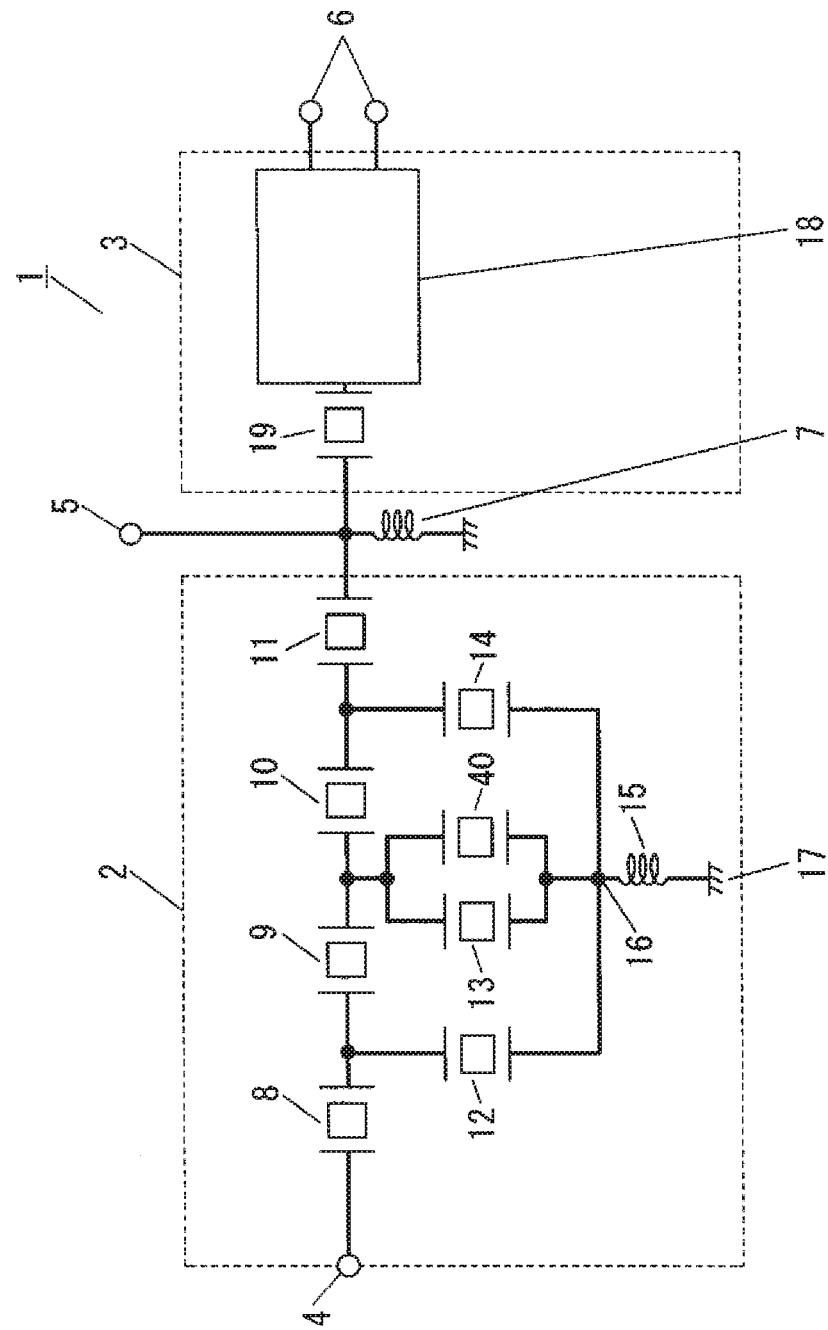
FIG. 7 is a circuit block diagram of an antenna duplexer including a ladder-type elastic wave filter in accordance with a second exemplary embodiment of the present disclosure.

Hereinafter, an elastic wave element in accordance with a second exemplary embodiment of the present disclosure is described with reference to drawings. FIG. 7 is a circuit block diagram of antenna duplexer 1 on which a ladder-type elastic wave filter in accordance with the second exemplary embodiment is mounted.

In FIG. 7, antenna duplexer 1 on which the ladder-type elastic wave filter in accordance with the second exemplary embodiment is mounted is, for example, an antenna duplexer for Band-8 of the UMTS system, and includes ladder-type elastic wave filter 2 as a transmission filter and reception filter 3 having a passband (925 MHz to 960 MHz) higher than a passband (880 MHz to 915 MHz) of ladder-type elastic wave filter 2.

Furthermore, antenna duplexer 1 includes phase shifter 7 connected between ladder-type elastic wave filter 2 and reception filter 3. Phase shifter 7 allows the passband of each of the transmission and reception filters to have a higher impedance in view of each other so as to improve isolation between the transmission and reception filters.

Reception filter 3 includes, for example, resonator 19 and longitudinal mode coupled filter 18, which are connected between antenna terminal 5 and output terminal (balanced terminal) 6, and receives a received signal from antenna terminal 5 and outputs it from output terminal 6.

Ladder-type elastic wave filter 2 as the transmission filter is connected between input terminal 4 and antenna terminal 5 (an output terminal of ladder-type elastic wave filter 2), receives a transmission signal from input terminal 4 and outputs it from antenna terminal 5. Ladder-type elastic wave filter 2 includes series resonators 8, 9, 10, and 11 each of which is connected to each of a plurality of series arms, and first parallel resonators 12, 13, and 14 each of which is connected to each of a plurality of parallel arms, in which series resonators 8, 9, 10 and 11 and first parallel resonators 12, 13 and 14 are connected to each other in a ladder form. Resonance frequencies of first parallel resonators 12, 13, and 14 are lower than resonance frequencies or antiresonance frequencies of series resonators 8, 9, 10, and 11.

Furthermore, ground terminal 17 sides of first parallel resonators 12, 13, and 14 are connected to each other at connection part 16, ladder-type elastic wave filter 2 includes inductor 15 connected between connection part 16 and ground terminal 17.

In such a ladder-type elastic wave filter 2 as the transmission filter in antenna duplexer 1, the antiresonance frequencies of series resonators 8, 9, 10, and 11 are set in the vicinity of the passband of ladder-type elastic wave filter 2 in a frequency region higher than the passband of ladder-type elastic wave filter 2, and the resonance frequencies of first parallel resonators 12, 13, and 14 are set in the vicinity of the passband of ladder-type elastic wave filter 2 in a frequency region lower than the passband of ladder-type elastic wave filter 2. Attenuation poles are thus formed in the both vicinities of the passband of ladder-type elastic wave filter 2 at the higher and lower frequency sides.

In addition, in antenna duplexer 1, ladder-type elastic wave filter 2 includes third parallel resonator 40 connected in parallel to first parallel resonator 13 by one of the parallel arms and having resonance frequency higher than antiresonance frequencies of resonators 8, 9, 10, and 11. Third parallel resonator 40 operates as a band attenuation filter (notch filter) that attenuates an input signal around the resonance frequency of third parallel resonator 40. Note here that third parallel resonator 40 may be singly connected to a parallel arm between one of the series resonators and the ground terminal without being connected to any of the parallel arms to which the first parallel resonators are connected, respectively.

With the above-mentioned configuration, in ladder-type elastic wave filter 2, an attenuation pole is formed at a frequency (resonance frequency of third parallel resonator 40) that is apart from the passband of ladder-type elastic wave filter 2 in a frequency region higher than the passband. Thus, it is possible to secure attenuation characteristics in the frequency band that is apart from this passband of ladder-type elastic wave filter 2 in a frequency region higher than the passband.

Each component of ladder-type elastic wave filter 2 of the second exemplary embodiment is described below in detail. In ladder-type elastic wave filter 2, series resonators 8, 9, 10, and 11, first parallel resonators 12, 13, and 14, and third parallel resonator are formed on a piezoelectric substrate (not shown). Furthermore, inductor 15 may be formed on a laminated ceramic substrate (not shown) on which a piezoelectric substrate is mounted, or may be formed on the piezoelectric substrate directly or indirectly via a dielectric layer.

The piezoelectric substrate is, for example, lithium niobate ($LiNbO_3$)-based, or lithium tantalate ($LiTaO_3$)-based piezoelectric monocrystal substrates. When a dielectric layer is formed on the piezoelectric substrate, the dielectric layer is, for example, silicon oxide ($SiO_2$), silicon nitride (SiN), aluminum nitride (AlN), or a laminated body thereof.

Each of series resonators 8, 9, 10, and 11, first parallel resonators 12, 13, and 14, and parallel resonator 40 is formed of a pair of comb electrodes and two reflectors sandwiching the comb electrodes. The comb electrodes constituting these resonators are formed of, for example, simple substance of metal including aluminum, copper, silver, gold, titanium, tungsten, molybdenum, platinum, or chromium, or alloys including the metal as a main component, or a laminated body thereof. Note here that the comb electrode may be an electrode that excites a surface acoustic wave such as SH (Shear Horizontal) wave, Reilly, or the like, as primary wave, or may be an electrode that excites a bulk wave such as a Lamb wave.

Each of the numbers of electrode fingers (finger), the interdigitating width of electrode fingers [μm] and capacitance [pF] of series resonators 8, 9, 10, and 11, first parallel resonators 12, 13, and 14, and third parallel resonator 40 are shown in Table 3.

TABLE 3

|  | number of electrode fingers (finger) | interdigitating width of electrode fingers (μm) | capacitance (pF) |
|---|---|---|---|
| series resonator 8 | 176 | 185 | 5.1 |
| first parallel resonator 12 | 164 | 154 | 4.2 |
| series resonator 9 | 178 | 41 | 1.1 |
| first parallel resonator 13 | 98 | 91 | 2.5 |
| series resonator 10 | 130 | 75 | 2.1 |
| first parallel resonator 14 | 116 | 117 | 3.2 |
| series resonator 11 | 130 | 60 | 1.6 |
| third parallel resonator 40 | 36 | 39 | 1.1 |

The numbers of electrode fingers (finger), the interdigitating width of electrode fingers [μm] and capacitance [pF] of series resonators 108, 109, 110, and 111, and parallel resonators 112, 113, and 114 of conventional ladder-type elastic wave filter 102 of FIG. 13 is shown in Table 4.

TABLE 4

|  | number of electrode fingers (finger) | interdigitating width of electrode fingers (μm) | capacitance (pF) |
|---|---|---|---|
| series resonator 108 | 176 | 185 | 5.1 |
| parallel resonator 112 | 164 | 154 | 4.2 |
| series resonator 109 | 178 | 41 | 1.1 |

TABLE 4-continued

| | number of electrode fingers (finger) | interdigitating width of electrode fingers (μm) | capacitance (pF) |
|---|---|---|---|
| parallel resonator 113 | 98 | 131 | 3.5 |
| series resonator 110 | 130 | 75 | 2.1 |
| parallel resonator 114 | 116 | 117 | 3.2 |
| series resonator 111 | 130 | 60 | 1.6 |

Figure 8:
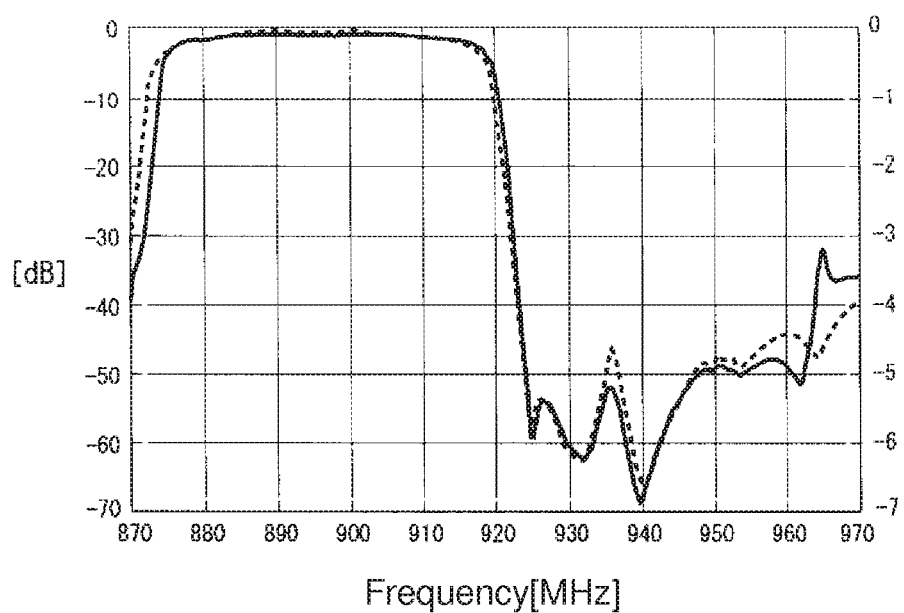
FIG. 8 is a characteristic comparison graph between the ladder-type elastic wave filter in accordance with the second exemplary embodiment of the present disclosure and a conventional ladder-type elastic wave filter.

Characteristic comparison between ladder-type elastic wave filter 2 of the second exemplary embodiment and conventional ladder-type elastic wave filter 102 is shown in FIG. 8. A solid line in FIG. 8 shows a characteristic of ladder-type elastic wave filter 2 of the first exemplary embodiment and a broken line shows a characteristic of conventional ladder-type elastic wave filter 102. In FIG. 8, the abscissa shows frequency [MHz], and the ordinate shows a gain [dB].

As shown in FIG. 8, it is understood that in ladder-type elastic wave filter 2, steepness in an attenuation amount is improved in a frequency band that is apart from the passband in the frequency region higher than the passband as compared with that of the conventional ladder-type elastic wave filter 102.

Furthermore, in such a ladder-type elastic wave filter 2, FIGS. 9A to 9K show characteristic comparison between ladder-type elastic wave filter 2 of the second exemplary embodiment and conventional ladder-type elastic wave filter 102 when capacitance C1 of first parallel resonator 13 and capacitance C2 of third parallel resonator 40 are varied as shown in A to K of Table 5 while the sum of capacitance C1 of first parallel resonator 13 and capacitance C2 of third parallel resonator 40 is made to be a constant value, 3.6 [pF].

TABLE 5

| | capacitance C1 of first parallel resonator 13 | capacitance C2 of third parallel resonator 40 | C2/(C1 + C2) |
|---|---|---|---|
| A | 3.6 | 0 | 0 |
| B | 3.24 | 0.36 | 0.1 |
| C | 2.88 | 0.72 | 0.2 |
| D | 2.52 | 1.08 | 0.3 |
| E | 2.16 | 1.44 | 0.4 |
| F | 1.8 | 1.8 | 0.5 |
| G | 1.44 | 2.16 | 0.6 |
| H | 1.08 | 2.52 | 0.7 |
| I | 0.72 | 2.88 | 0.8 |
| J | 0.36 | 3.24 | 0.9 |
| K | 0 | 3.6 | 1 |

Figure 9A:
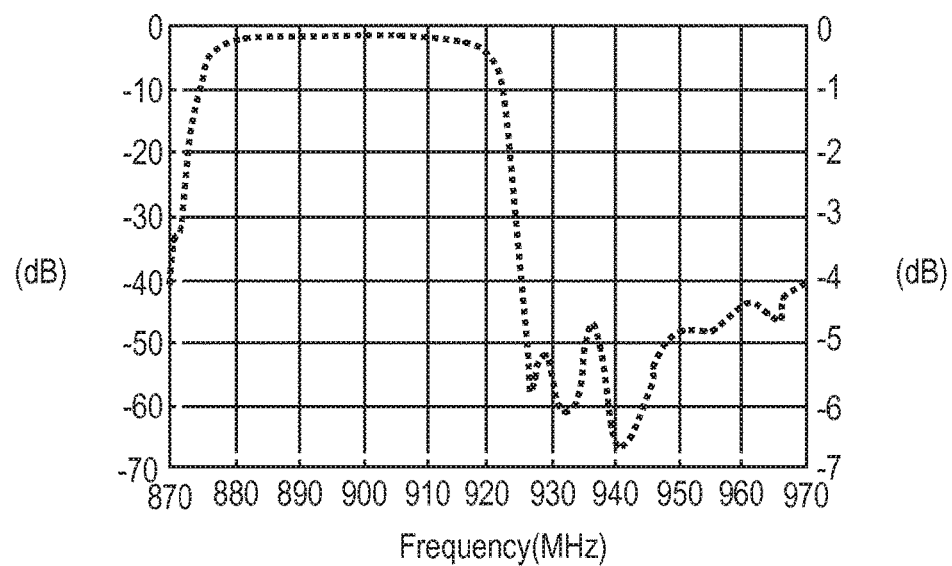
FIG. 9A is a characteristic graph of a conventional ladder-type elastic wave filter.
Figure 9B:
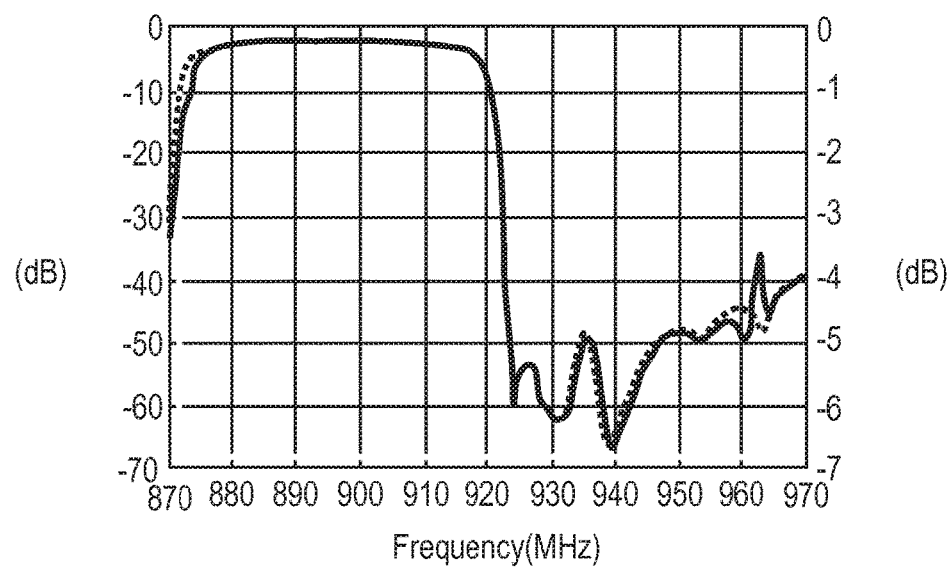
FIG. 9B is a characteristic comparison graph between the ladder-type elastic wave filter in accordance with the second exemplary embodiment of the present disclosure and a conventional ladder-type elastic wave filter.
Figure 9C:
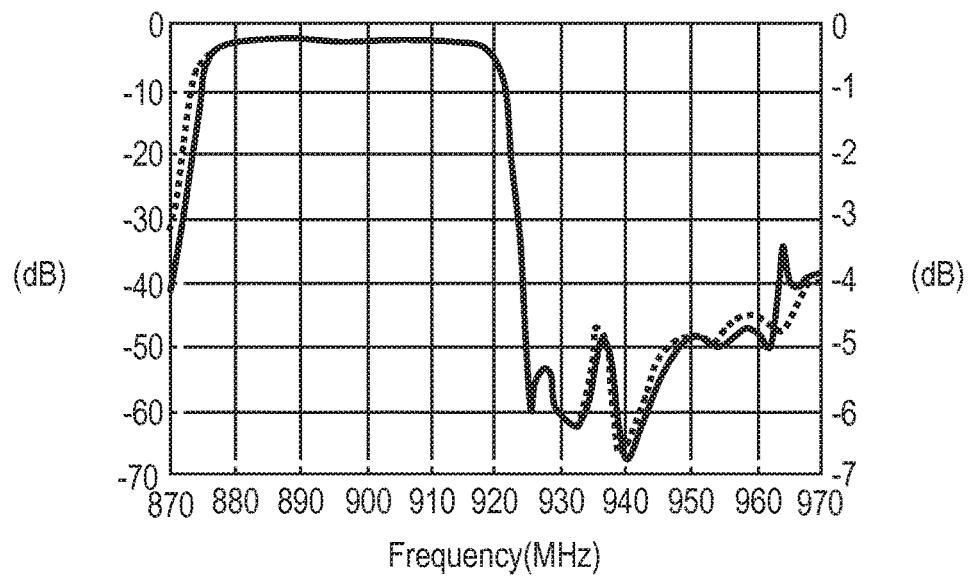
FIG. 9C is a characteristic comparison graph between the ladder-type elastic wave filter in accordance with the second exemplary embodiment of the present disclosure and a conventional ladder-type elastic wave filter.
Figure 9D:
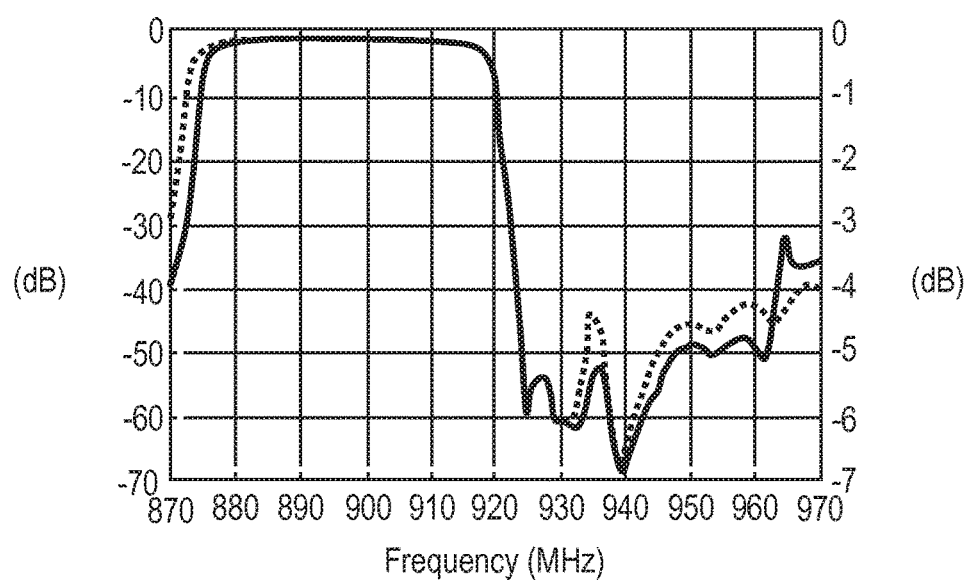
FIG. 9D is a characteristic comparison graph between the ladder-type elastic wave filter in accordance with the second exemplary embodiment of the present disclosure and a conventional ladder-type elastic wave filter.
Figure 9E:
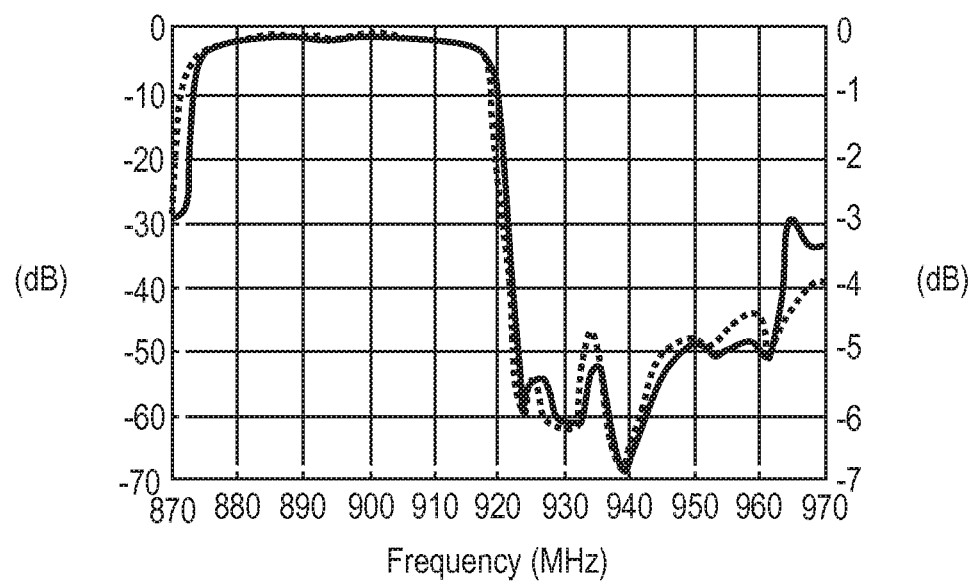
FIG. 9E is a characteristic comparison graph between the ladder-type elastic wave filter in accordance with the second exemplary embodiment of the present disclosure and a conventional ladder-type elastic wave filter.
Figure 9F:
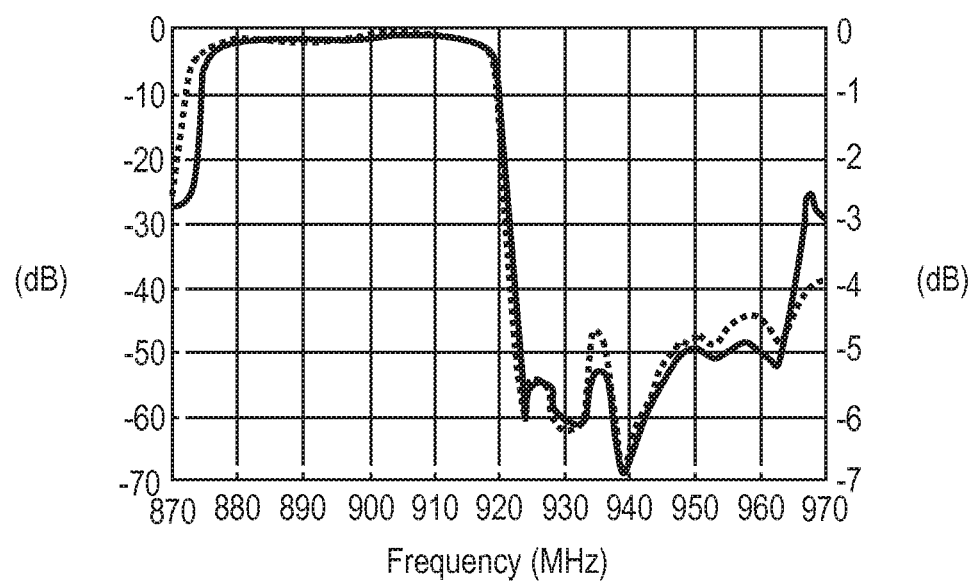
FIG. 9F is a characteristic comparison graph between the ladder-type elastic wave filter in accordance with the second exemplary embodiment of the present disclosure and a conventional ladder-type elastic wave filter.
Figure 9G:
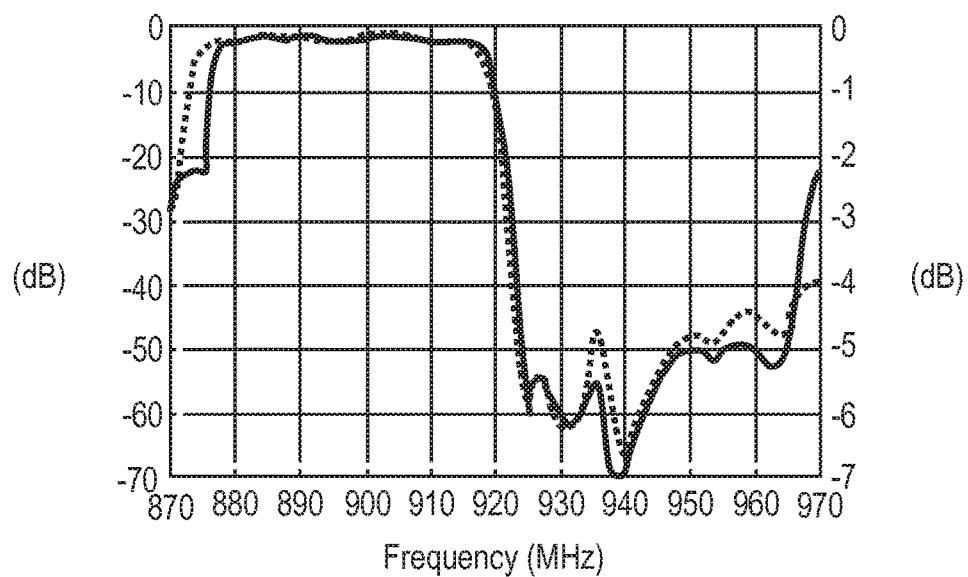
FIG. 9G is a characteristic comparison graph between the ladder-type elastic wave filter in accordance with the second exemplary embodiment of the present disclosure and a conventional ladder-type elastic wave filter.
Figure 9H:
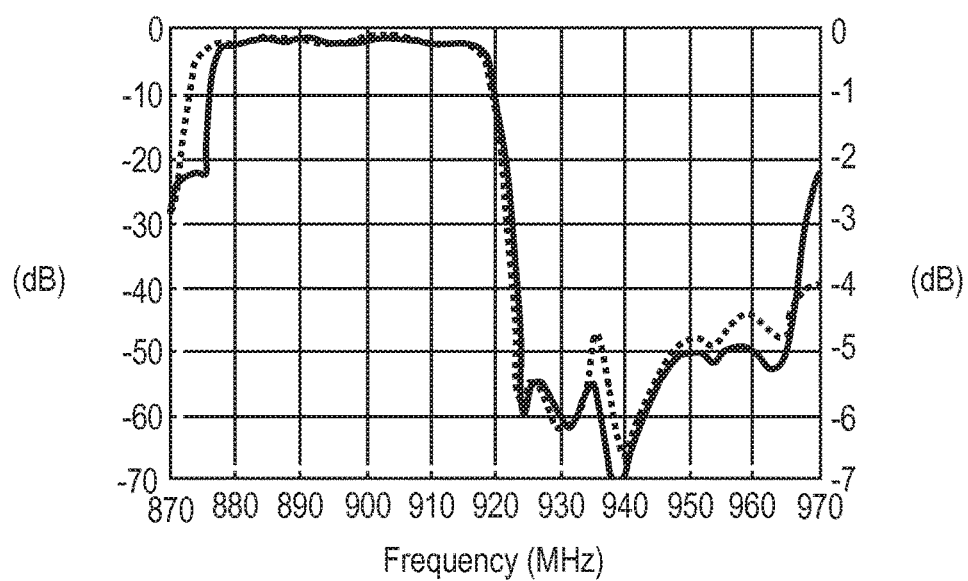
FIG. 9H is a characteristic comparison graph between the ladder-type elastic wave filter in accordance with the second exemplary embodiment of the present disclosure and a conventional ladder-type elastic wave filter.
Figure 9I:
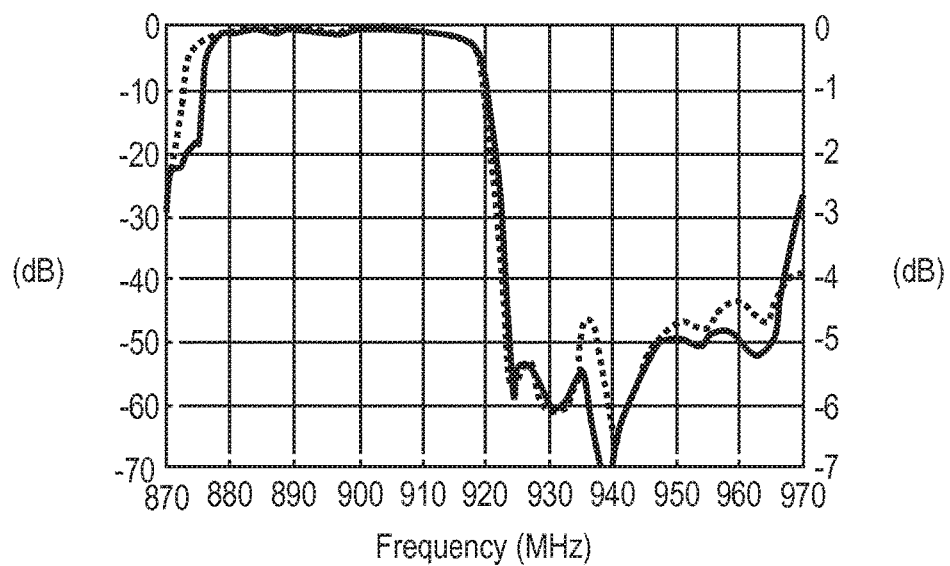
FIG. 9I is a characteristic comparison graph between the ladder-type elastic wave filter in accordance with the second exemplary embodiment of the present disclosure and a conventional ladder-type elastic wave filter.
Figure 9J:
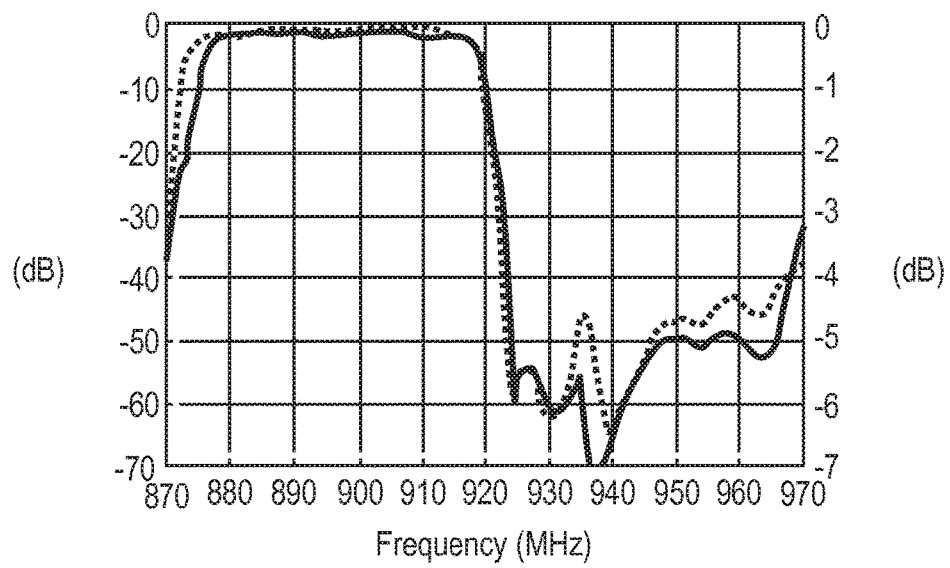
FIG. 9J is a characteristic comparison graph between the ladder-type elastic wave filter in accordance with the second exemplary embodiment of the present disclosure and a conventional ladder-type elastic wave filter.
Figure 9K:
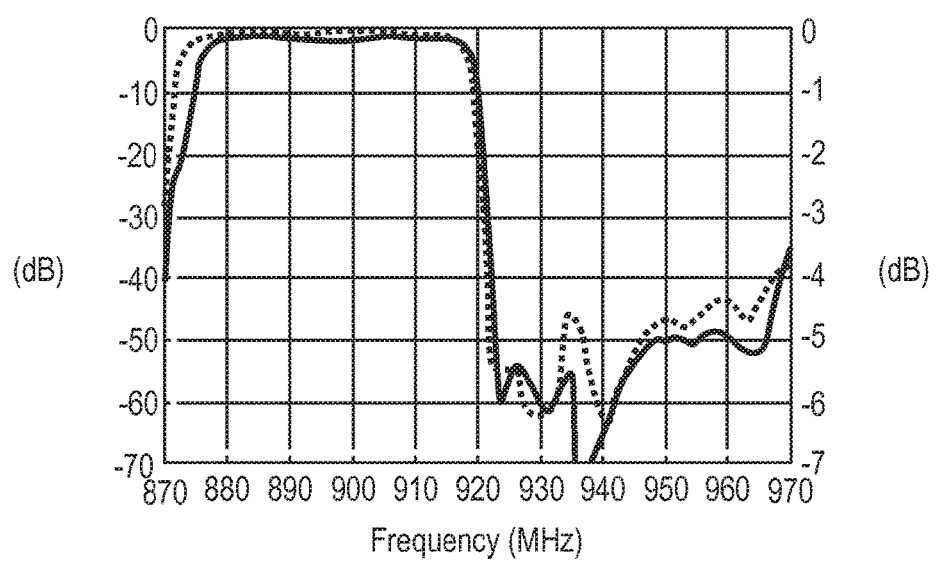
FIG. 9K is a characteristic comparison graph between the ladder-type elastic wave filter in accordance with the second exemplary embodiment of the present disclosure and a conventional ladder-type elastic wave filter.

FIG. 9A shows a case in which a ratio value of capacitance C2 of third parallel resonator 40 with respect to the total of capacitance C1 of first parallel resonator 13 and capacitance C2 of third parallel resonator 40 is zero, that is, C2/(C1+C2)=0 is satisfied; FIG. 9B shows a case in which C2/(C1+C2)=0.1 is satisfied; FIG. 9C shows a case in which C2/(C1+C2)=0.2 is satisfied; FIG. 9D shows a case in which C2/(C1+C2)=0.3 is satisfied; FIG. 9E shows a case in which C2/(C1+C2)=0.4 is satisfied; FIG. 9F shows a case in which C2/(C1+C2)=0.5 is satisfied; FIG. 9G shows a case in which C2/(C1+C2)=0.6 is satisfied; FIG. 9H shows a case in which C2/(C1+C2)=0.7 is satisfied; FIG. 9I shows a case in which C2/(C1+C2)=0.8 is satisfied; FIG. 9J shows a case in which C2/(C1+C2)=0.9 is satisfied; and FIG. 9K shows a case in which C2/(C1+C2)=1 is satisfied, respectively.

As shown in FIGS. 9A to 9K, when the relation between capacitance C1 of first parallel resonator 13 and capacitance C2 of third parallel resonator 40 satisfies 0.1≤C2/(C1+C2) ≤0.7, ladder-type elastic wave filter 2 can secure an attenuation amount in the frequency band that is apart from the passband in a frequency region higher than the passband and can suppress loss deterioration in this passband. When C2/(C1+C2)≤0.7 is satisfied, the loss deterioration in the passband of ladder-type elastic wave filter 2 can be suppressed because, in this case, it is possible to suppress the deterioration of electromechanical coupling coefficient K2 calculated from the equivalent circuit that synthesizes first parallel resonator 13 and third parallel resonator 40.

In particular, as shown in FIGS. 9A to 9K, when the relation between capacitance C1 of first parallel resonator 13 and capacitance C2 of third parallel resonator 40 satisfies 0.1≤C2/(C1+C2)≤0.5, ladder-type elastic wave filter 2 can secure an attenuation amount in the frequency band that is apart from the passband in the frequency region higher than the passband and can further suppress loss deterioration in this passband.

Furthermore, as shown in FIG. 7, it is desirable that third parallel resonator 40 is connected in parallel to first parallel resonator 13 by one of the parallel arms. First parallel resonator 13 has the smallest capacitance among first parallel resonators 12, 13, and 14. As mentioned above, whether or not it is possible to achieve both securing an attenuation amount in the frequency band that is apart from the passband in the frequency region higher than the passband of ladder-type elastic wave filter 2 and suppressing loss deterioration in this passband depends upon the ratio of capacitance C1 of first parallel resonator 13 with respect to capacitance C2 of third parallel resonator 40. That is to say, in order to achieve the both, third parallel resonator 40 is connected in parallel to first parallel resonator 13 having the smallest capacitance by one of the parallel arms, and thus the capacitance of third parallel resonator 40 can be made to be smaller. As a result, an occupied area of third parallel resonator 40 in ladder-type elastic wave filter 2 is reduced, and the size of ladder-type elastic wave filter 2 can be reduced.

In addition, as shown in FIG. 7, it is desirable that third parallel resonator 40 is connected in parallel to first parallel resonator 13 by one of the parallel arms. First parallel resonator 13 is other than first parallel resonator 12 that is nearest to input terminal 4 among the first parallel resonators. The electrode finger pitch of third parallel resonator 40 is smaller than electrode finger pitches of series resonators 8, 9, 10, and 11, and first parallel resonators 12, 13, and 14, and electric power resistance of third parallel resonator 40 is relatively low. Thus, when third parallel resonator 40 is not connected to the parallel arm at an input terminal 4 side that requires the largest electric power resistance but connected to a parallel arm other than the parallel arm, electric power resistance of ladder-type elastic wave filter 2 can be improved.

Figure 10:
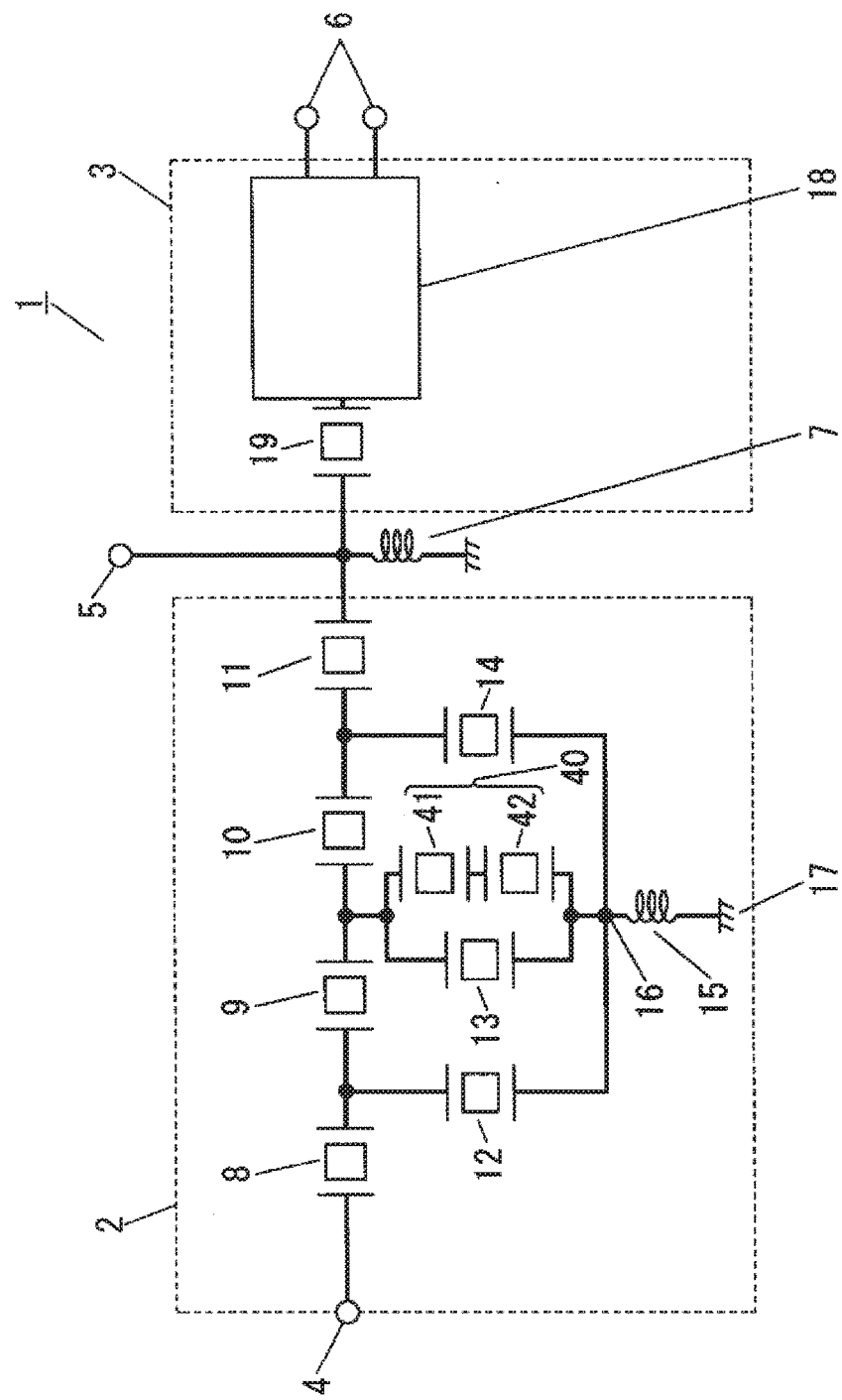
FIG. 10 is a circuit block diagram of an antenna duplexer including a ladder-type elastic wave filter in accordance with the second exemplary embodiment of the present disclosure.

Furthermore, as shown in FIG. 10, it is desirable that third parallel resonator 40 has a configuration in which each of a plurality of resonators 41 and 42 is cascade connected to each other. The electrode finger pitch of third parallel resonator 40 is smaller than the electrode finger pitches of series resonators 8, 9, 10, and 11, and first parallel resonators 12, 13, and 14, and electric power resistance of third parallel resonator 40 is relatively low. Thus, when third parallel resonator 40 includes cascade-connected resonators 41 and 42, electric power resistance of third parallel resonator 40 is improved, and electric power resistance of ladder-type elastic wave filter 2 can be enhanced. In particular, the cascade connection configuration of resonators 41 and 42 is particularly preferable because electric power resistance of third parallel resonator 40 can be enhanced when the capacitance of third parallel resonator 40 is not more than that of first parallel resonator 13 connected to the same parallel arm as that of third parallel resonator 40.

Note here that the capacitance of each of resonators 41 and 42 is twice as large as the capacitance of third parallel resonator 40 shown in FIG. 7. As the means, for example, an interdigitating width of electrode fingers of each of resonators 41 and 42 may be twice as that of third parallel resonator 40 in FIG. 7, or the number of electrode fingers may be twice as many as that of third parallel resonator 40 in FIG. 7. As described above, when third parallel resonator 40 includes a plurality of cascade-connected resonators, by making capacitance of each resonator equal to each other, the electric power resistance of third parallel resonator 40 can be further improved, and electric power resistance of ladder-type elastic wave filter 2 can be further improved. Furthermore, when the capacitance of third parallel resonator 40 is not more than the capacitance of first parallel resonator 13, by making a total occupied area of resonators 41 and 42 constituting third parallel resonator 40 larger than that of first parallel resonator 13, the electric power resistance of third parallel resonator 40 can be improved.

Figure 11:
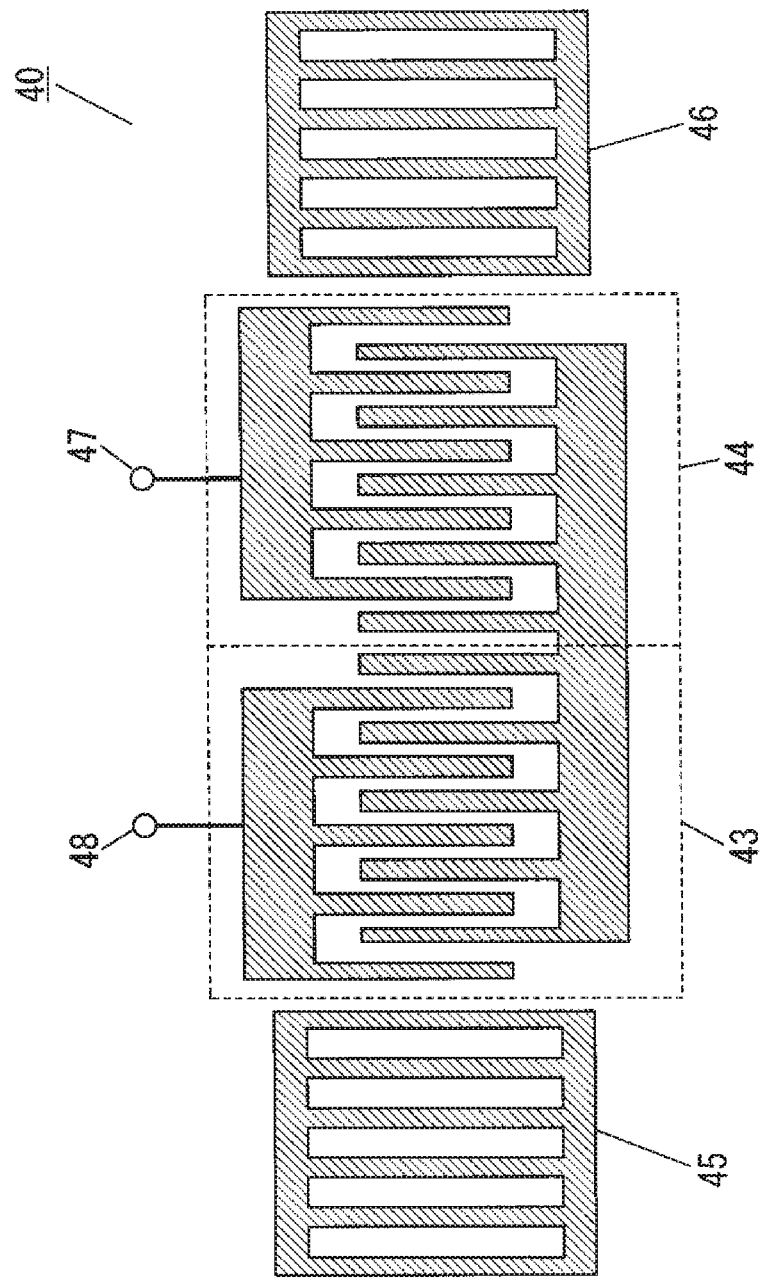
FIG. 11 is an upper schematic view of a second parallel resonator of the ladder-type elastic wave filter in accordance with the second exemplary embodiment of the present disclosure.

Furthermore, third parallel resonator 40 shown in FIG. 10 is divided in a propagation direction of the elastic wave as shown in FIG. 11, and may be a resonator including comb electrodes having electrode fingers in which each of the divided regions 43 and 44 is disposed in an opposite phase to each other, and reflectors 45 and 46 sandwiching the resonator. Each of the divided regions 43 and 44 forms each of resonators 43 and 44 shown in FIG. 10. Note here that terminal 47 is connected to series resonators 9 and 10, and terminal 48 is connected to connection part 16. With this configuration, an area of electric power of third parallel resonator 40 can be reduced and the attenuation pole formed by third parallel resonator 40 is increased, thus the attenuation characteristics in the frequency region higher than the passband of ladder-type elastic wave filter 2 are improved. Note here that third parallel resonator 40 shown in FIGS. 10 and 11 is divided into two parts, but it may be three parts or more so as to further improve the electric power resistance of third parallel resonator 40.

Furthermore, in antenna duplexer 1 such as a duplexer including a first filter and a second filter having a passband higher than a passband of the first filter, when ladder-type elastic wave filter 2 is used as the first filter having a relatively low passband, an attenuation amount in the passband of the second filter can be secured by the first filter. That is to say, in the case of the above-mentioned ladder-type elastic wave filter 2, an attenuation amount in the passband of the reception filter 3 can be secured. However, ladder-type elastic wave filter 2 may be used as a second filter having a relatively high passband.

Furthermore, ladder-type elastic wave filter 2 of the second exemplary embodiment may be mounted on an electronic apparatus provided with a semiconductor integrated circuit element (not shown) connected to the filter and an audio unit (not shown) such as a loudspeaker connected to the semiconductor integrated circuit element (not shown). Thus, communication quality of the electronic apparatus can be improved.

Third Exemplary Embodiment

Figure 12:
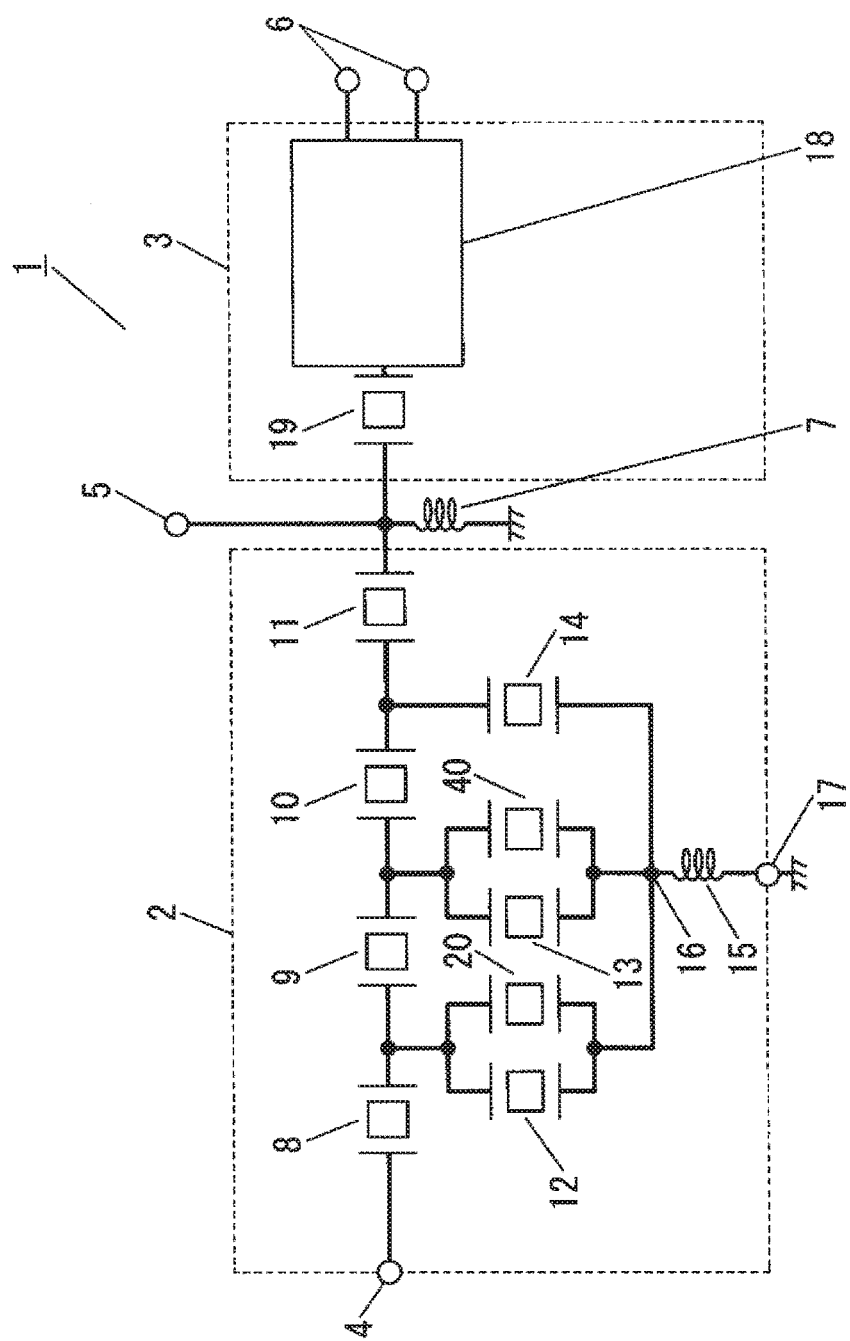
FIG. 12 is a circuit block diagram of an antenna duplexer including a ladder-type elastic wave filter in accordance with a third exemplary embodiment of the present disclosure.

Hereinafter, an elastic wave element in accordance with a third exemplary embodiment of the present disclosure is described with reference to drawings. FIG. 12 is a circuit block diagram of antenna duplexer 1 on which a ladder-type elastic wave filter in accordance with the third exemplary embodiment of the present disclosure is mounted. Unless otherwise described, a configuration of the elastic wave element of the third exemplary embodiment is the same configurations as those of the elastic wave elements of the first and second exemplary embodiments.

In FIG. 12, antenna duplexer 1 on which the ladder-type elastic wave filter is mounted in accordance with the third exemplary embodiment is, for example, an antenna duplexer for Band-8 of the UMTS system, and includes ladder-type elastic wave filter 2 as a transmission filter and reception filter 3 having a passband (925 MHz to 960 MHz) higher than a passband (880 MHz to 915 MHz) of ladder-type elastic wave filter 2.

Antenna duplexer 1 includes phase shifter 7 connected between ladder-type elastic wave filter 2 and reception filter 3. Phase shifter 7 allows the passband of each of the transmission and reception filters to have a higher impedance in view of each other so as to improve isolation between the transmission and reception filters.

Reception filter 3 includes, for example, resonator 19 and longitudinal mode coupled filter 18, which are connected between antenna terminal 5 and output terminal (balanced terminal) 6, and receives a received signal from antenna terminal 5 and outputs it from output terminal 6.

Ladder-type elastic wave filter 2 as the transmission filter is connected between input terminal 4 and antenna terminal 5 (an output terminal of ladder-type elastic wave filter 2), receives a transmission signal from input terminal 4 and outputs it from antenna terminal 5. Ladder-type elastic wave filter 2 includes series resonators 8, 9, 10, and 11 each of which is connected to each of a plurality of series arms, and first parallel resonators 12, 13, and 14 each of which is connected to each of a plurality of parallel arms, in which series resonators 8, 9, 10, and 11 and first parallel resonators 12, 13, and 14 are connected to each other in a ladder form. Resonance frequencies of first parallel resonators 12, 13, and 14 are lower than resonance frequencies or antiresonance frequencies of series resonators 8, 9, 10, and 11.

Furthermore, ground terminal 17 sides of first parallel resonators 12, 13, and 14 are connected to each other at connection part 16, ladder-type elastic wave filter 2 includes inductor 15 connected between connection part 16 and ground terminal 17.

In ladder-type elastic wave filter 2 thus constructed as the transmission filter in antenna duplexer 1, the antiresonance frequencies of series resonators 8, 9, 10, and 11 are set in the vicinity of the passband of ladder-type elastic wave filter 2 in a frequency region higher than the passband of ladder-type elastic wave filter 2, and the resonance frequencies of first parallel resonators 12, 13, and 14 are set in the vicinity of the passband of ladder-type elastic wave filter 2 in a frequency region lower than the passband of ladder-type elastic wave filter 2. Attenuation poles are thus formed in the both vicinities of the passband of ladder-type elastic wave filter 2 at the higher and lower frequency sides.

In addition, in antenna duplexer 1, ladder-type elastic wave filter 2 includes second parallel resonator 20 connected in parallel to first parallel resonator 12 by one of the parallel arms and having a resonance frequency higher than the series resonance frequencies of resonators 8, 9, 10, and 11 and lower than the antiresonance frequencies of series resonators 8, 9, 10, and 11. Second parallel resonator 20 operates as a band attenuation filter (notch filter) that attenuates an input signal around the resonance frequency of second parallel resonator 20. Note here that second parallel resonator 20 may be singly connected to a parallel arm between one of the series resonators and the ground terminal without being connected to any of the parallel arms to which the first parallel resonators are connected, respectively.

With the above-mentioned configuration, in ladder-type elastic wave filter 2, an attenuation pole formed by the second parallel resonator is formed in a frequency region lower than the attenuation pole formed by the series resonators in a frequency region higher than the passband of ladder-type elastic wave filter 2. This makes it possible to secure steepness of the passing characteristics in a frequency region higher than the passband of ladder-type elastic wave filter 2.

Thus, when the resonance frequency of second parallel resonator 20 is set to be lower than the antiresonance frequency of series resonator 8 having the lowest antiresonance frequency among series resonators 8, 9, 10, and 11 in ladder-type elastic wave filter 2, the antiresonance frequency of series resonator 8 can be shifted from the antiresonance frequency of conventional series resonator 108 to a higher frequency region side, and heat generation of series resonator 8 can be suppressed. In this case, in second parallel resonator 20, since excitation of primary elastic wave in the frequency region lower than the resonance frequency is suppressed, heat generation is suppressed. As a result, electric power resistance of ladder-type elastic wave filter 2 can be improved.

In addition, in antenna duplexer 1, ladder-type elastic wave filter 2 includes third parallel resonator 40 connected in parallel to first parallel resonator 13 by one of the parallel arms and having resonance frequency higher than antiresonance frequencies of resonators 8, 9, 10, and 11. Third parallel resonator 40 operates as a band attenuation filter (notch filter) that attenuates an input signal around the resonance frequency of third parallel resonator 40. Note here that third parallel resonator 40 may be singly connected to a parallel arm between one of the series resonators and the ground terminal without being connected to any of the parallel arms to which the first parallel resonators are connected, respectively.

With the above-mentioned configuration, in ladder-type elastic wave filter 2, an attenuation pole is formed in a frequency (resonance frequency of third parallel resonator 40) that is apart from the passband of ladder-type elastic wave filter 2 in a frequency region higher than the passband. Thus, it is possible to secure attenuation characteristics in the frequency band that is apart from the passband of ladder-type elastic wave filter 2 in the frequency region higher than the passband.

That is to say, by connecting second parallel resonator 20 and third parallel resonator 40 in parallel to a signal line, it is possible to secure attenuation characteristics in both in the vicinity of the passband of ladder-type elastic wave filter 2 in the frequency region higher than the passband and in a frequency band that is apart from the passband.

Furthermore, it is desirable that capacitance of second parallel resonator 20 is smaller than capacitance of third parallel resonator 40. The reason for this is described below. In a frequency region lower than the attenuation pole formed by second parallel resonator 20, second parallel resonator 20 as a band attenuation filter shows capacitative property. Thus, when capacitance of second parallel resonator 20 is larger than capacitance of third parallel resonator 40, steepness is deteriorated in the frequency region lower than the attenuation pole formed by second parallel resonator 20 and in the frequency region higher than the passband of ladder-type elastic wave filter 2. Then, when the capacitance of second parallel resonator 20 is made to be smaller than capacitance of third parallel resonator 40, steepness can be improved in the frequency region higher than the passband of ladder-type elastic wave filter 2.

Furthermore, when the capacitance of second parallel resonator 20 is smaller than the capacitance of third parallel resonator 40, and when at least second parallel resonator 20 in second parallel resonator 20 and third parallel resonator 40 includes a plurality of cascade-connected resonators, it is desirable that the number of resonators constituting second parallel resonator 20 is larger than the number of resonator (s) constituting third parallel resonator 40.

When the capacitance of second parallel resonator 20 is smaller than the capacitance of third parallel resonator 40, the electric power resistance of second parallel resonator 20 is lower as compared with the electric power resistance of third parallel resonator 40. Thus, when the number of resonators constituting second parallel resonator 20 is made to be larger than the number of resonator(s) constituting third parallel resonator 40, the electric power resistance of third parallel resonator 40 can be secured, and the electric power resistance of ladder-type elastic wave filter 2 can be improved.

Furthermore, in antenna duplexer 1 such as a duplexer including a first filter and a second filter having a passband higher than a passband of the first filter, when ladder-type elastic wave filter 2 is used as the first filter having a relatively low passband, an attenuation amount in the passband of the second filter can be secured by the first filter. That is to say, in the case of the above-mentioned ladder-type elastic wave filter 2, an attenuation amount in the passband of the reception filter 3 can be secured. However, ladder-type elastic wave filter 2 may be used as a second filter having a relatively high passband.

Furthermore, ladder-type elastic wave filter 2 of the third exemplary embodiment may be mounted on an electronic apparatus provided with a semiconductor integrated circuit element (not shown) connected to the filter and an audio unit (not shown) such as a loudspeaker connected to the semiconductor integrated circuit element (not shown). Thus, communication quality of the electronic apparatus can be improved.

A ladder-type elastic wave filter in accordance with the present disclosure has a feature in which steepness of passing characteristic in a frequency region higher than the passband of a ladder-type elastic wave filter is secured, and it can is applicable for electronic apparatuses such as a portable telephone.

What is claimed is:
1. A ladder-type elastic wave filter comprising:
   an input terminal, an output terminal, and a ground terminal;
   a first series resonator and a second series resonator connected in series between the input terminal and the output terminal; and
   a first parallel resonator having a first terminal electrically connected to the series connection between the first series resonator and the second series resonator and a second terminal electrically connected to the ground terminal, a resonance frequency of the first parallel resonator being higher than a resonance frequency of both of the first series resonator and the second series resonator and lower than an antiresonance frequency of both of the first series resonator and the second series resonator.

2. The ladder-type elastic wave filter of claim 1 further comprising a second parallel resonator connected in parallel to the first parallel resonator.

3. The ladder-type elastic wave filter of claim 2 wherein the first parallel resonator has a capacitance smaller than a capacitance of the second parallel resonator.

4. The ladder-type elastic wave filter of claim 3 further comprising a plurality of parallel arms, the second parallel resonator being connected between the first series resonator and the second series resonator via one of the plurality of parallel arms, and the first parallel resonator being connected between the first series resonator and the second series resonator via one of the plurality of parallel arms that is other than a parallel arm among the plurality of parallel arms which is nearest to the input terminal.

5. The ladder-type elastic wave filter of claim 2 further comprising:
a piezoelectric substrate;
comb electrodes formed on the piezoelectric substrate, the comb electrodes including a first comb electrode included in the first parallel resonator and a second comb electrode included in the second parallel resonator; and
a dielectric layer covering the first comb electrode and having a frequency temperature coefficient with an opposite sign to a frequency temperature coefficient of the piezoelectric substrate, the dielectric layer not covering the second comb electrode.

6. The ladder-type elastic wave filter of claim 2 further comprising:
a piezoelectric substrate;
comb electrodes formed on the piezoelectric substrate, the comb electrodes including a first comb electrode included in the first parallel resonator and a second comb electrode included in the second parallel resonator; and
a dielectric layer covering the comb electrodes and having a frequency temperature coefficient with an opposite sign to a frequency temperature coefficient of the piezoelectric substrate, a part of the dielectric layer covering the first comb electrode being thicker than a part of the dielectric layer covering the second comb electrode.

7. The ladder-type elastic wave filter of claim 1 further comprising a second parallel resonator having a first terminal electrically connected to the series connection between the first series resonator and the second series resonator and a second terminal electrically connected to the ground terminal and having a resonance frequency lower than the resonance frequency of both of the first series resonator and the second series resonator and lower than the antiresonance frequency of both of the first series resonator and the second series resonator.

8. An antenna duplexer comprising:
a first filter including the ladder-type elastic wave filter of claim 1; and
a second filter having a passband higher than a passband of the first filter.

9. The ladder-type elastic wave filter of claim 1 wherein the first parallel resonator includes cascade-connected resonators, each of the cascade-connected resonators having an equal capacitance.

10. A ladder-type elastic wave filter comprising:
an input terminal, an output terminal, and a ground terminal;
a first series resonator, a second series resonator, and a third series resonator connected in series between the input terminal and the output terminal;
a first parallel resonator having a first terminal electrically connected to the series connection between the first series resonator and the second series resonator and a second terminal electrically connected to the ground terminal, a resonance frequency of the first parallel resonator being higher than a resonance frequency of both of the first series resonator and the second series resonator and lower than an antiresonance frequency of both of the first series resonator and the second series resonator; and
a second parallel resonator having a first terminal electrically connected to the series connection between the second series resonator and the third series resonator and a second terminal electrically connected to the ground terminal and having a resonance frequency higher than the antiresonance frequency of both of the second series resonator and the third series resonator.

11. The ladder-type elastic wave filter of claim 10 further comprising a third parallel resonator having a first terminal electrically connected to the series connection between the first series resonator and the second series resonator and a second terminal electrically connected to the ground terminal and having a resonance frequency lower than the resonance frequency of both of the first series resonator and the second series resonator and lower than an antiresonance frequency of both of the first series resonator and the second series resonator.

12. The ladder-type elastic wave filter of claim 11 wherein the first parallel resonator has a capacitance smaller than a capacitance of the second parallel resonator.

13. The ladder-type elastic wave filter of claim 12 wherein the first parallel resonator includes cascade-connected resonators, and the second parallel resonator includes fewer cascade-connected resonators than a number of cascade-connected resonators included in the first parallel resonator.

14. An antenna duplexer comprising:
a first filter including the ladder-type elastic wave filter of claim 10; and
a second filter having a passband higher than a passband of the first filter.

15. A ladder-type elastic wave filter comprising:
an input terminal, an output terminal, and a ground terminal;
a first series resonator and a second series resonator connected in series between the input terminal and the output terminal;
a first parallel resonator having a first terminal electrically connected to the series connection between the first series resonator and the second series resonator and a second terminal electrically connected to the ground terminal and having a resonance frequency higher than an antiresonance frequency of both of the first series resonator and the second series resonator; and
a second parallel resonator having a first terminal electrically connected to the series connection between the first series resonator and the second series resonator and a second terminal electrically connected to the ground terminal and having a resonance frequency lower than a resonance frequency of the both of the first series resonator and the second series resonator and lower than the antiresonance frequency of both of the first series resonator and the second series resonator, the first parallel resonator having a capacitance lower than a capacitance of the second parallel resonator.

16. The ladder-type elastic wave filter of claim 15 wherein the second parallel resonator includes a plurality of second parallel resonators, the ladder-type elastic wave filter includes the plurality of second parallel resonators and parallel arms each connecting the series connection between the first series resonator and the second series resonator to one of the plurality of second parallel resonators, and the first parallel resonator is connected in parallel to one of the plurality of second parallel resonators via one of the parallel arms, the one of the plurality of second parallel resonators having a smallest capacitance among the plurality of second parallel resonators.

17. The ladder-type elastic wave filter of claim 15 further comprising a plurality of parallel arms, the second parallel resonator being connected to the series connection between the first series resonator and the second series resonator via one of the plurality of parallel arms, and the first parallel resonator being connected to the series connection between the first series resonator and the second series resonator via one of the plurality of parallel arms that is other than a parallel arm among the plurality of parallel arms which is nearest to the input terminal.

18. The ladder-type elastic wave filter of claim 15 wherein a relation between the capacitance $C1$ of the first parallel resonator and the capacitance $C2$ of the second parallel resonator satisfies a condition of $0.1 \leq C1/(C1+C2) \leq 0.7$.

19. The ladder-type elastic wave filter of claim 15 wherein a relation between the capacitance $C1$ of the first parallel resonator and the capacitance $C2$ of the second parallel resonator satisfies a condition of $0.1 \leq C1/(C1+C2) \leq 0.5$.

20. An antenna duplexer comprising:
a first filter including the ladder-type elastic wave filter of claim 15; and
a second filter having a passband higher than a passband of the first filter.

* * * * *